US012777960B2

(12) United States Patent
Kim et al.

(10) Patent No.: US 12,777,960 B2
(45) Date of Patent: Oct. 27, 2026

(54) FAN OUT PACKAGE FOR A SEMICONDUCTOR POWER MODULE

(71) Applicant: SEMICONDUCTOR COMPONENTS INDUSTRIES, LLC, Scottsdale, AZ (US)

(72) Inventors: Jihwan Kim, Seoul (KR); Seungwon Im, Bucheon (KR); Oseob Jeon, Seoul (KR); Hangil Shin, Incheon (KR); Taekyun Kim, Bucheon (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 465 days.

(21) Appl. No.: 18/480,897

(22) Filed: Oct. 4, 2023

(65) Prior Publication Data

US 2024/0363575 A1 Oct. 31, 2024

Related U.S. Application Data

(60) Provisional application No. 63/498,127, filed on Apr. 25, 2023.

(51) Int. Cl.
*H10W 74/01* (2026.01)
*H10W 70/05* (2026.01)
(Continued)

(52) U.S. Cl.
CPC ....... *H10W 74/019* (2026.01); *H10W 70/479* (2026.01); *H10W 74/014* (2026.01);
(Continued)

(58) Field of Classification Search
CPC ............. H10W 74/019; H10W 74/114; H10W 74/014; H10W 90/00; H10W 90/10;
(Continued)

(56) References Cited

U.S. PATENT DOCUMENTS

2002/0127780 A1 9/2002 Ma et al.
2006/0163648 A1 * 7/2006 Hauenstein ........... H01L 23/488 257/E23.012

(Continued)

FOREIGN PATENT DOCUMENTS

DE 102015115999 A1 3/2016

OTHER PUBLICATIONS

International Search Report and Written Opinion for PCT Application No. PCT/US2024/023920, mailed on Jul. 15, 2024, 15 pages.

*Primary Examiner* — Eric W Jones
(74) *Attorney, Agent, or Firm* — Brake Hughes Bellermann LLP

(57) ABSTRACT

A fan out package may include a plurality of semiconductor dies, each of the semiconductor dies including a first surface and a second surface opposite to the first surface. The fan out package includes a redistribution layer coupled to the first surface of each of the plurality of semiconductor dies, a dieback conductive member coupled to the second surface of each of the plurality of semiconductors dies, and an encapsulation material coupled to the plurality of semiconductor dies and the dieback conductive member.

20 Claims, 25 Drawing Sheets

(51) Int. Cl.

| | |
|---|---|
| ***H10W 70/20*** | (2026.01) |
| ***H10W 70/40*** | (2026.01) |
| ***H10W 70/60*** | (2026.01) |
| ***H10W 70/685*** | (2026.01) |
| ***H10W 72/00*** | (2026.01) |
| ***H10W 74/10*** | (2026.01) |
| ***H10W 90/00*** | (2026.01) |
| ***H10W 90/10*** | (2026.01) |

(52) U.S. Cl.

CPC .......... *H10W 74/114* (2026.01); *H10W 90/00* (2026.01); *H10W 70/093* (2026.01); *H10W 70/24* (2026.01); *H10W 70/60* (2026.01); *H10W 70/685* (2026.01); *H10W 72/0198* (2026.01); *H10W 72/874* (2026.01); *H10W 90/10* (2026.01); *H10W 90/401* (2026.01); *H10W 90/736* (2026.01)

(58) Field of Classification Search

CPC ............. H10W 90/401; H10W 90/736; H10W 70/479; H10W 70/685; H10W 70/093; H10W 70/24; H10W 70/60; H10W 72/0198; H10W 72/874

USPC .......................................................... 257/668

See application file for complete search history.

(56) References Cited

U.S. PATENT DOCUMENTS

| | | | | |
|---|---|---|---|---|
| 2008/0012045 | A1* | 1/2008 | Muto ................ | H01L 23/49562 438/117 |
| 2013/0020694 | A1* | 1/2013 | Liang .................... | H01L 23/473 257/691 |
| 2014/0087499 | A1* | 3/2014 | Doan ..................... | B82Y 20/00 257/E33.056 |
| 2016/0260651 | A1* | 9/2016 | Yeung ................. | H01L 23/3675 |
| 2019/0181125 | A1 | 6/2019 | Cho | |
| 2019/0385986 | A1 | 12/2019 | Zhang et al. | |
| 2021/0057372 | A1* | 2/2021 | Oh ......................... | H05K 7/209 |
| 2022/0230930 | A1* | 7/2022 | Grassmann ......... | H01L 23/3121 |
| 2022/0406744 | A1 | 12/2022 | Eom et al. | |
| 2023/0032353 | A1 | 2/2023 | Nakano et al. | |
| 2023/0197557 | A1* | 6/2023 | Kim .................... | H01L 23/3735 257/678 |

* cited by examiner

FAN OUT PACKAGE FOR A SEMICONDUCTOR POWER MODULE

BACKGROUND

Some conventional fan out packages may include an encapsulation material applied to the backside of the semiconductor dies.

SUMMARY

In some aspects, the techniques described herein relate to a fan out package including: a plurality of semiconductor dies, each of the semiconductor dies including a first surface and a second surface opposite to the first surface; a redistribution layer coupled to the first surface of each of the plurality of semiconductor dies; a dieback conductive member coupled to the second surface of each of the plurality of semiconductors dies; and an encapsulation material coupled to the plurality of semiconductor dies and the dieback conductive member.

In some aspects, the techniques described herein relate to a power module including: a substrate; a first fan out package coupled to the substrate; and a second fan out package coupled to the substrate, each of the first fan out package and the second fan out package including: a plurality of semiconductor dies, each of the semiconductor dies including a first surface and a second surface opposite to the first surface; a redistribution layer coupled to the first surface of each of the plurality of semiconductor dies; a dieback conductive member coupled to the second surface of each of the plurality of semiconductors dies; and an encapsulation material coupled to the plurality of semiconductor dies and the dieback conductive member.

In some aspects, the techniques described herein relate to a method for manufacturing a fan out package, the method including: coupling a dieback conductive member to a first surface of each of a plurality of semiconductor dies; applying an encapsulation material to the dieback conductive member and the plurality of semiconductor dies; forming a redistribution layer on a second surface of each of the plurality of semiconductor dies; and removing a portion of the encapsulation material to expose a surface of the dieback conductive member.

The details of one or more implementations are set forth in the accompanying drawings and the description below. Other features will be apparent from the description and drawings, and from the claims.

DETAILED DESCRIPTION

Figure 1A:
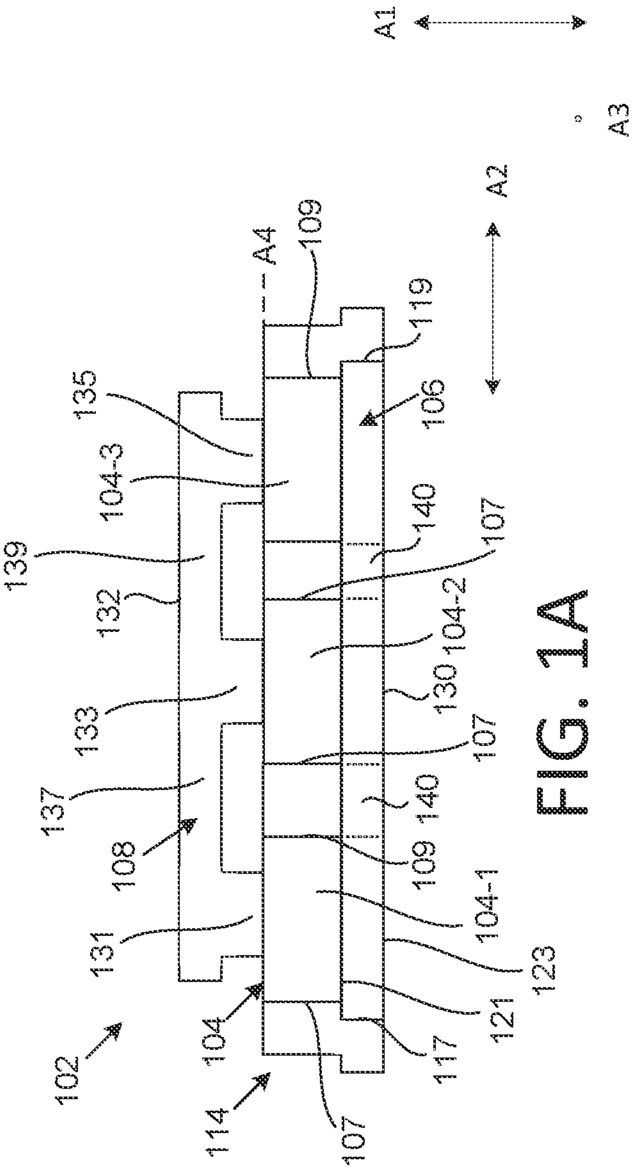
FIG. 1A illustrates a fan out package according to an aspect.

The present disclosure relates to a fan out package that enables the backside of power semiconductor dies to function as an electrode. In some examples, the fan out package includes a plurality of semiconductor dies, a redistribution layer coupled to each of the plurality of semiconductor dies, and a dieback conductive member coupled to each of the plurality of semiconductor dies. The semiconductor dies may include power semiconductor dies such as a silicon insulated-gate bipolar transistor or a silicon carbide metal-oxide-semiconductor field-effect transistor. In some examples, the dieback conductive member is coupled to the backside (e.g., the drain or collector) of the semiconductor dies. The dieback conductive member may enable the dies' backside to function as an electrode. In some examples, the dieback conductive member may form a drain or collector contact (e.g., contact pad) that is common to the semiconductor dies. In some examples, the dieback conductive member includes a conductive spacer. The conductive spacer is a unitary (single) body of conductive material that is coupled to each of the semiconductor dies. In some examples, the dieback conductive member includes a plurality of conductive plates, where each conductive plate is coupled to a separate semiconductor die. In some examples, a conductive layer (e.g., copper plating) is coupled to the plurality of conductive plates.

In some examples, the present disclosure relates to a power module that includes one or more fan out packages. In some examples, the power module includes a first fan out package and a second fan out package. In some examples, the power module includes a dual side cooling (DSC) power module. For example, the power module may include a first substrate (e.g., a direct bonded copper (DBC) substrate), a second substrate (e.g., DBC substrate), and first and second fan out packages disposed between and coupled to the first substrate and the second substrate. In some examples, the power module includes lead frame portions disposed between and coupled to the first substrate and the second substrate. The redistribution layer of the first fan out package is coupled to the first substrate, and the redistribution layer of the second fan out package is coupled to the second substrate (e.g., one of the fan out packages is flipped with respect to the other fan out package).

In some examples, the power module includes a single side cooling (SSC) power module. For example, the power module may include a substrate (e.g., a direct bonded copper (DBC) substrate), a clip member, and first and second fan out packages disposed between and coupled to the substrate and the clip member. In some examples, the power module includes lead frame portions disposed between and coupled to the substrate and the clip member. The dieback conductive member of the first fan out package may be coupled to the substrate, and the dieback conductive member of the second fan out package may be coupled to the substrate. The redistribution layer of the first fan out package may be coupled to the clip member, and the redistribution layer of the second fan out package may be coupled to the clip member.

The fan out package's design may improve thermal and/or electrical performance by increasing the size of contact pads (e.g., source pad, drain pad), reduce the overall size (and/or cost) of the power module, increase package scalability, and provide better compatibility for DSC and/or SSC power modules. For example, the fan out package's design may avoid the use of a lead frame to provide electrical functionality to the die's backside, which can increase the design flexibility, thereby making it suitable for more power applications. Also, the fan out package's design uses a redistribution layer on the front side (e.g., the source terminal, gate terminal) of the semiconductor dies, which may enable a relatively large area for a single common source pad (thereby improving the heat dissipation). In some conventional power modules, the front side (e.g., the source, the gate) of the semiconductor dies are directly attached to the substrate (e.g., without the use of a redistribution layer), but these types of designs may limit the effective source pad size, thereby limiting the heat dissipation through the source pad. In addition, the fan out package's design may avoid additional manufacturing process(es) and/or additional metallization because the dieback conductive member is exposed after over-mold grinding (e.g., during the manufacturing process of the individual fan out packages) but before a molding is formed on the overall power module.

Figure 1B:
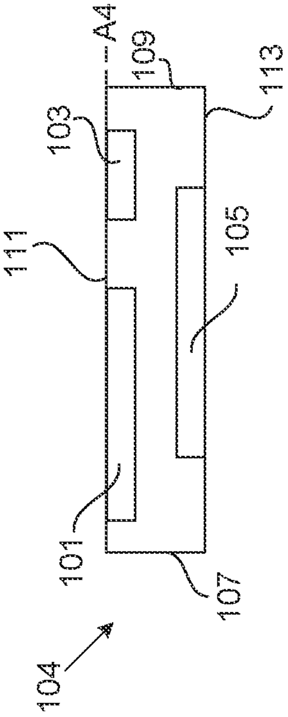
FIG. 1B illustrates a semiconductor power die according to an aspect.

FIGS. 1A to 1B illustrate a fan out package 102 according to an aspect. The fan out package 102 may be a subcomponent within a larger power module. In some examples, the fan out package 102 is included in a single side cooling (SSC) power module or a dual side cooling (DSC) power module. In some examples, the fan out package 102 enables the backside of semiconductor dies 104 to function as an electrode. The fan out package 102 may improve thermal and/or electrical performance by increasing the size of contact pads (e.g., a source pad 132, a drain pad 130). In some examples, the fan out package 102 may increase its scalability and/or provide better compatibility for incorporation into a power module. In some examples, the structure of the fan out package 102 may reduce the overall size (and/or cost) of a power module that includes the fan out package(s).

The fan out package 102 includes a plurality of semiconductor dies 104. The semiconductor dies 104 are power semiconductor dies. A semiconductor die 104 includes a transistor. In some examples, a semiconductor die 104 includes a metal-oxide-semiconductor field-effect transistor (MOSFET). In some examples, a semiconductor die 104 includes an insulated-gate bipolar transistor (IGBT). In some examples, a semiconductor die 104 includes a thyristor. In some examples, the semiconductor dies 104 of multiple instances of the same type of transistor. The semiconductor dies 104 may include a semiconductor die 104-1, a semiconductor die 104-2, and a semiconductor die 104-3. Although three semiconductor dies 104 are depicted in FIG. 1A, the number of semiconductor dies 104 may be two or any number greater than three such as four, five, six, seven, eight, etc. In some examples, the fan out package 102 includes three or more semiconductor dies 104.

As shown in FIG. 1B, each semiconductor die 104 includes a first surface 111 (e.g., a top surface) and a second surface 113 (e.g., a bottom surface) opposite to the first surface 111. The second surface 113 may be disposed in parallel with the first surface 111. The distance between the first surface 111 and the second surface 113 may define the thickness of the semiconductor die 104 in the direction A1. In some examples, the first surface 111 of each semiconductor die 104 are aligned with each other in the direction A1. The first surface 111 is aligned in a plane A4. A direction A1 is aligned perpendicular to the plane A4, and a direction A2 is perpendicular to the direction A1. A direction A3 into the page (shown as a dot in FIGS. 1A and 1B) is aligned parallel to the plane A4 and is orthogonal to directions A1 and A2. The directions A1, A2, and A3, and plane A4, are used throughout several of the various views of the implementations described throughout the figures for simplicity. Each semiconductor die 104 includes a source terminal 101, a gate terminal 103, and a drain terminal 105. In some examples, the drain terminal 105 is referred to as a collector terminal. In some examples, the drain terminal 105 is referred to as an emitter terminal. The source terminal 101, the gate terminal 103, and the drain terminal 105 may be metalized regions in the semiconductor die 104.

The fan out package 102 includes a redistribution layer 108 coupled to the semiconductor dies 104. The redistribution layer 108 includes a metal layer (e.g., patterned metallization) that redistributes current. The redistribution layer 108 is coupled to the first surface 111 of each semiconductor die 104. In some examples, the redistribution layer 108 is connected to the source terminal 101 of each semiconductor die 104. The redistribution layer 108 includes a portion 131 that contacts the source terminal 101 of the semiconductor die 104-1 and extends in the direction A1. The redistribution layer 108 includes a portion 133 that contacts the source terminal 101 of the semiconductor die 104-2 and extends in the direction A1. The redistribution layer 108 includes a portion 135 that contacts the source terminal 101 of the semiconductor die 104-3 and extends in the direction A1. The redistribution layer 108 includes a portion 137 that extends between the portion 131 and the portion 133 in the direction A2. The redistribution layer 108 includes a portion 139 that extends between the portion 133 and the portion 135. The redistribution layer 108 includes a source pad 132 on the outer surface of the redistribution layer 108. In some examples, the source pad 132 is a contact pad that is common to the semiconductor dies 104. The source pad 132 is configured to be connected to an external component (e.g., external to the fan out package 102).

The fan out package 102 includes a dieback conductive member 106 coupled to the semiconductor dies 104. For example, the dieback conductive member 106 is coupled to the second surface 113 of the semiconductor dies 104. In some examples, the dieback conductive member 106 is connected to the drain terminal 105 of each semiconductor die 104. In some examples, the dieback conductive member 106 is coupled to the backside (e.g., the drain terminal 105) of the semiconductor dies 104. The dieback conductive member 106 may enable the dies' backside to function as an electrode. The dieback conductive member 106 includes a drain pad 130. In other words, an outer surface of the dieback conductive member 106 may define a drain pad 130. In some examples, the drain pad 130 is a contact pad that is common to the semiconductor dies 104. The drain pad 130 is configured to be connected to an external component (e.g., external to the fan out package 102).

In some examples, the dieback conductive member 106 includes a conductive spacer. The conductive spacer is a unitary (single) body of conductive material that is coupled to each of the semiconductor dies 104. In some examples, the conductive spacer is a single piece of metal that has been cut into desired dimensions. In some examples, the conductive spacer includes a single conductive body with a rectangular shape. The conductive material includes a metal material such as copper or aluminum.

In some examples, the dieback conductive member 106 includes a plurality of conductive plates, where each conductive plate is coupled to a separate semiconductor die 104. In some examples, the conductive plates include copper plates. Each conductive plate is coupled to the second surface 113 and may extend in the direction A1. In some examples, the conductive plates are formed by coupling a conductive layer on the second surface 113 of each semiconductor die 104 and removing a portion 140 of conductive material between adjacent semiconductor dies 104. In some examples, a conductive layer (e.g., a conductive layer 780 in FIGS. 7A to 7C) is coupled to the conductive plates.

The fan out package 102 includes an encapsulation material 114 coupled to the semiconductor dies 104 and the dieback conductive member 106. For example, the encapsulation material 114 may contact an edge 107 of each semiconductor die 104 and an edge 109 of each semiconductor die 104. In some examples, the encapsulation material 114 extends along a length (e.g., the entire length) of the edge 107. In some examples, the encapsulation material 114 extends along a length (e.g., the entire length) of the edge 109. The edge 107 and the edge 109 may be opposing edges in the direction A2. The edge 107 and the edge 109 may extend between the first surface 111 and the second surface 113 in the direction A1.

The encapsulation material 114 may contact an edge 117 of the dieback conductive member 106 and an edge 119 of the dieback conductive member 106. In some examples, the encapsulation material 114 extends along a length (e.g., the entire length) of the edge 117 in the direction A1. In some examples, the encapsulation material 114 extends along a length (e.g., the entire length) of the edge 119 in the direction A1. The edge 117 and the edge 119 may be opposing edges in the direction A2. The edge 117 and the edge 119 may extend between a first surface 121 of the dieback conductive member 106 and a second surface 123 of the dieback conductive member 106 in the direction A1. The distance between the first surface 121 and the second surface 123 defines the thickness of the dieback conductive member 106 in the direction A1. In some examples, when the dieback conductive member 106 is conductive plates, the encapsulation material 114 is disposed in the space (e.g., the locations of portion 140) between adjacent conductive plates.

Figure 2A:
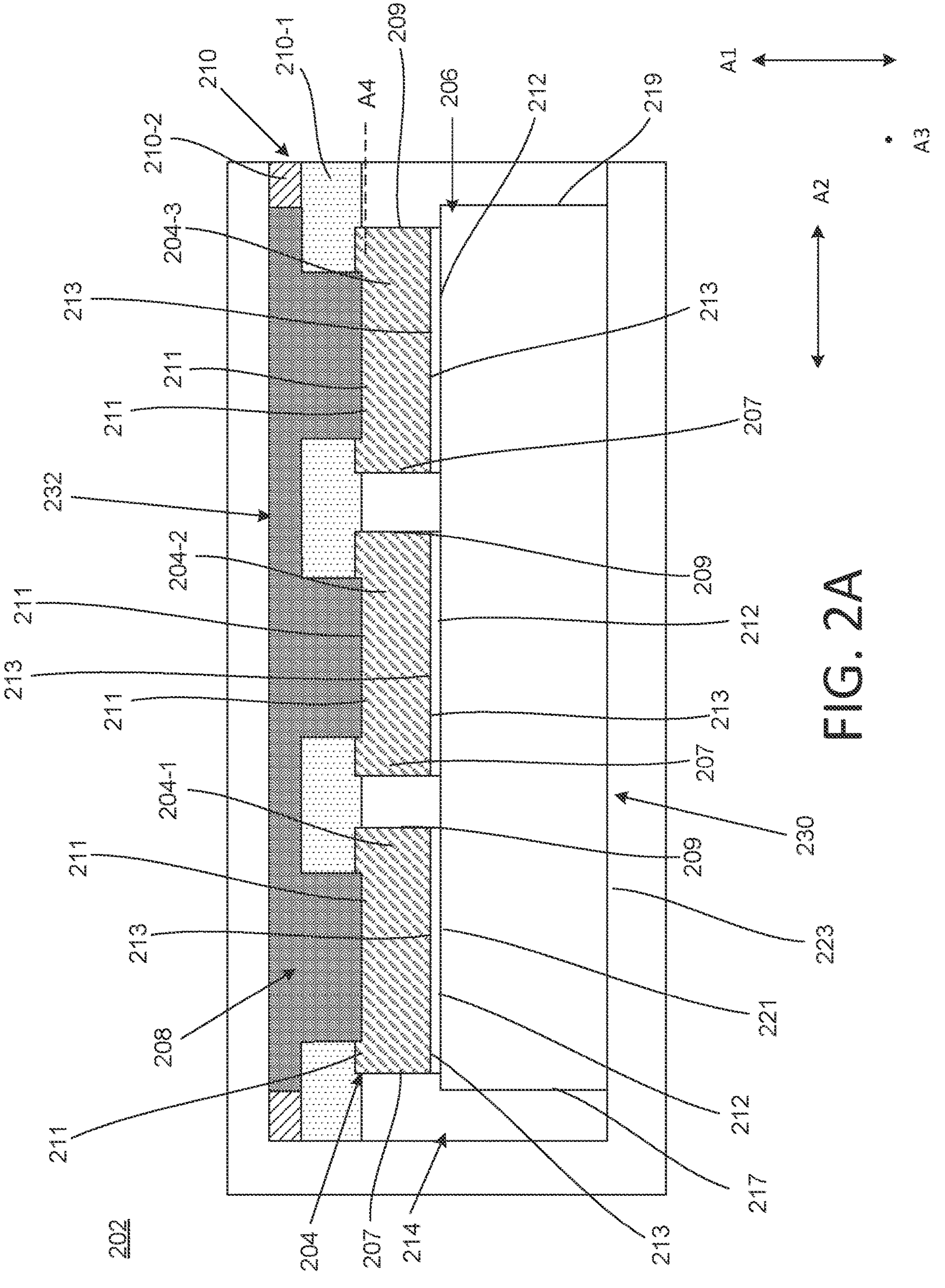
FIG. 2A illustrates a fan out package with a conductive spacer according to another aspect.
Figure 2B:
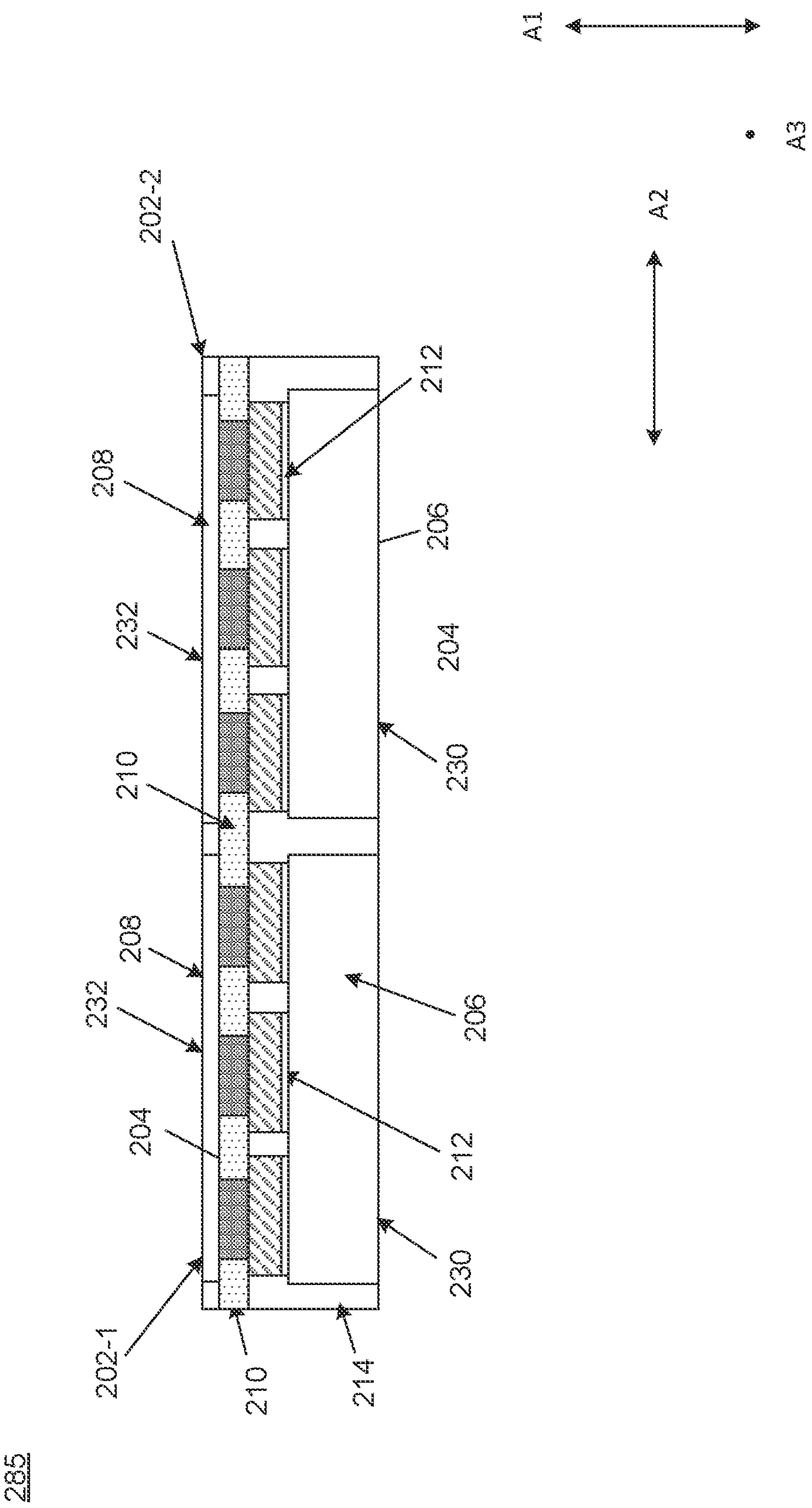
FIG. 2B illustrates a fan out package assembly with multiple fan out packages according to an aspect.
Figure 2C:
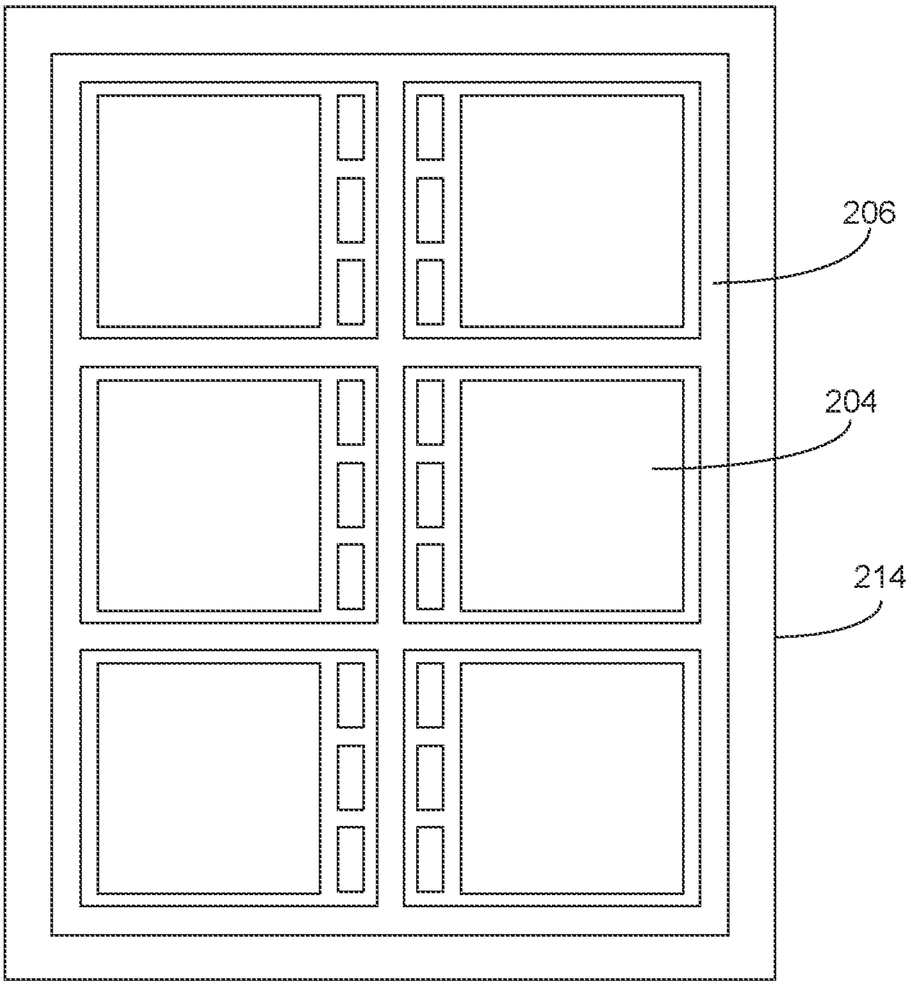
FIG. 2C illustrates a package construction view of the fan out package assembly according to an aspect.
Figure 2E:
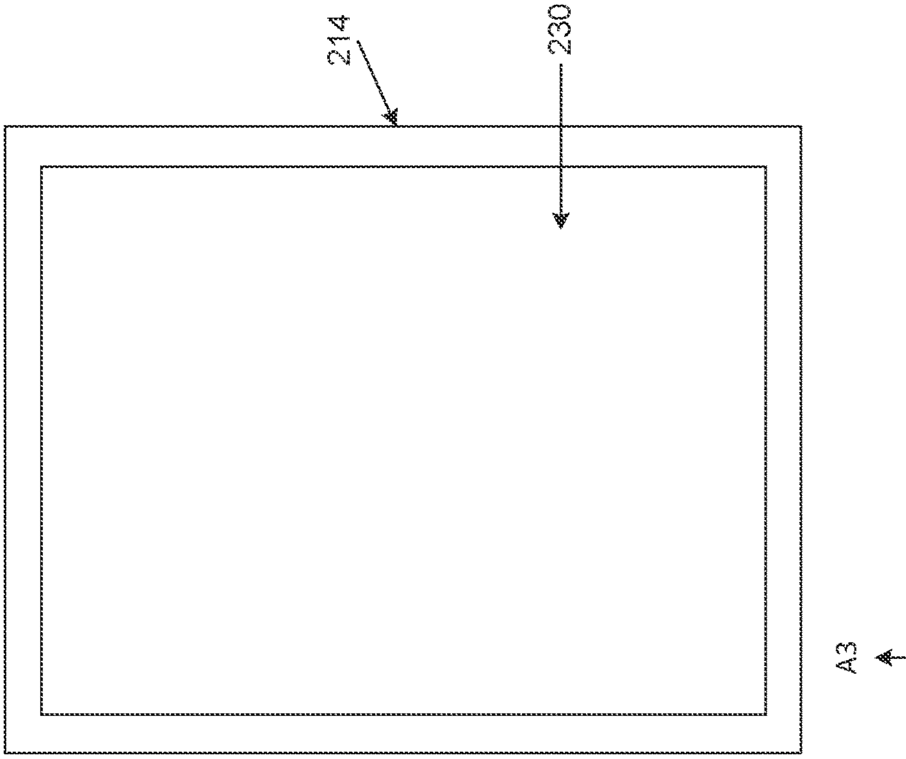
FIG. 2E illustrates a bottom view of the fan out package assembly according to an aspect.
Figure 2D:
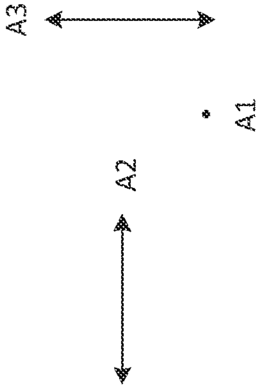
FIG. 2D illustrates a top view of the fan out package assembly according to an aspect.
Figure 2D:
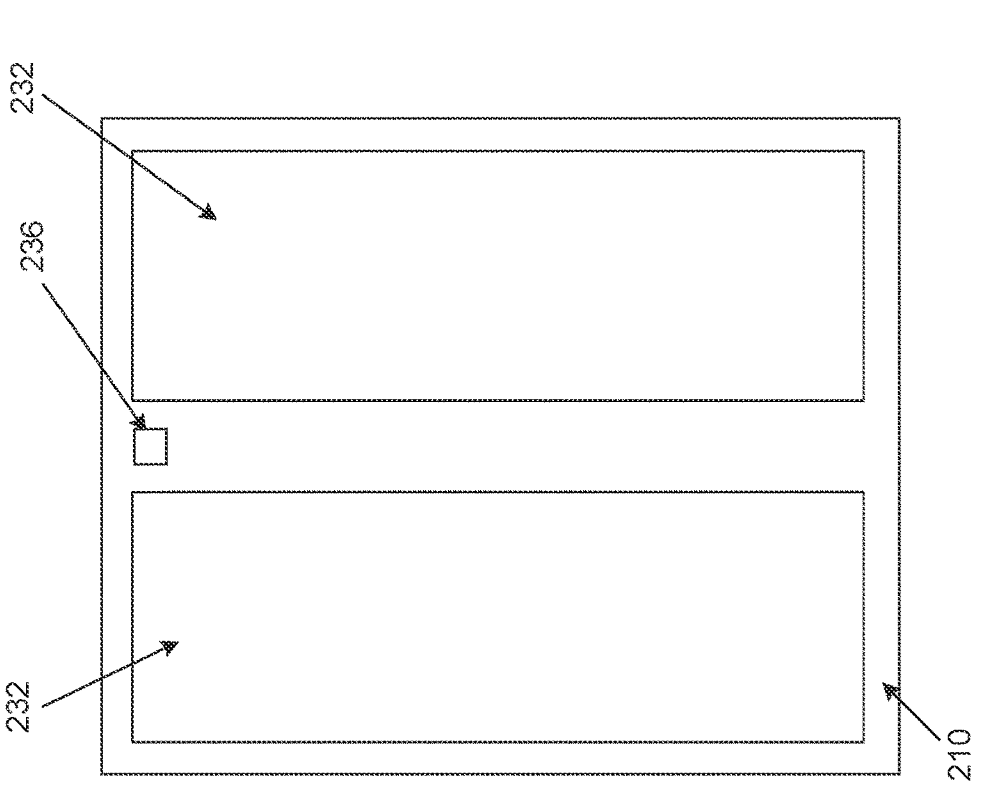

FIGS. 2A to 2E illustrate a fan out package 202 according to an aspect. FIG. 2A illustrates a side view of a single fan out package 202 according to an aspect. FIGS. 2B to 2E illustrate various views of a fan out package assembly 285 with multiple fan out packages 202. FIG. 2B illustrates a side view of a fan out package assembly 285 with two fan out packages 202 (e.g., before the fan out packages 202 are separated during the manufacturing process). As shown in FIG. 2B, the fan out package assembly 285 includes a first fan out package 202-1 and a second fan out package 202-2. The second fan out package 202-2 is the same as the first fan out package 202-1. FIG. 2C illustrates a package construction view of the fan out package assembly 285. FIG. 2D illustrates a top view of the fan out package assembly 285 depicting source pads 232 and a gate pad 236. FIG. 2E illustrates a bottom view of the fan out package assembly 285 depicting a drain pad 230.

The fan out package 202 may be an example of the fan out package 102 of FIGS. 1A and 1B and may include any of the details discussed with reference to those figures. The fan out package 202 may be a subcomponent within a larger power module. In some examples, the fan out package 202 is included in a single side cooling (SSC) power module or a dual side cooling (DSC) power module. In some examples, the fan out package 202 enables the backside of semiconductor dies 104 to function as an electrode.

The fan out package 202 includes a plurality of semiconductor dies 204. The semiconductor dies 204 are power semiconductor dies. A semiconductor die 204 includes a transistor. In some examples, a semiconductor die 204 includes a metal-oxide-semiconductor field-effect transistor (MOSFET). In some examples, a semiconductor die 204 includes an insulated-gate bipolar transistor (IGBT). In some examples, a semiconductor die 204 includes a thyristor. In some examples, the semiconductor dies 204 of multiple instances of the same type of transistor. The semiconductor dies 204 may include a semiconductor die 204-1, a semiconductor die 204-2, and a semiconductor die 204-3. Although three semiconductor dies 104 are depicted in FIGS. 2A to 2E, the number of semiconductor dies 204 may be two or any number greater than three such as four, five, six, seven, eight, etc. In some examples, the fan out package 202 includes three or more semiconductor dies 204.

Each semiconductor die 204 includes a first surface 211 (e.g., a top surface) and a second surface 213 (e.g., a bottom surface) opposite to the first surface 211. The second surface 213 may be disposed in parallel with the first surface 211. The distance between the first surface 211 and the second surface 213 may define the thickness of the semiconductor die 204 in the direction A1. In some examples, the first surface 211 of each semiconductor die 204 are aligned with each other in the direction A1. The first surface 211 is aligned in a plane A4. A direction A1 is aligned perpendicular to the plane A4, and a direction A2 is perpendicular to the direction A1. A direction A3 into the page is aligned parallel to the plane A4 and is orthogonal to directions A1 and A2. Each semiconductor die 204 includes a first edge 207 and a second edge 209. The distance between the first edge 207 and the second edge 209 defines the length of the semiconductor die 204 in the direction A2. The edge 207 and the edge 209 may extend between the first surface 211 and the second surface 213 in the direction A1.

The fan out package 202 includes a redistribution layer 208 coupled to the semiconductor dies 204. The redistribution layer 108 includes a metal layer (e.g., patterned metallization) that redistributes current. The redistribution layer 208 is coupled to the first surface 211 of each semiconductor die 204. In some examples, the redistribution layer 208 is connected to a source terminal of each semiconductor die 204. The redistribution layer 208 includes a source pad 232 on the outer surface of the redistribution layer 208. In some examples, the source pad 232 is a contact pad that is common to the semiconductor dies 204. The source pad 232 is configured to be connected to an external component (e.g., external to the fan out package 102).

The fan out package 202 includes a passivation layer 210 coupled to the first surface 211 of the semiconductor dies 204. A passivation layer 210 may include material silicon dioxide (SiO2), silicon nitride (Si3N4), and/or titanium dioxide (TiO2). In some examples, the passivation layer 210 is aligned in plane (in the direction A1) that is the same as the redistribution layer 208. In some examples, the passivation layer 210 is disposed on the semiconductor dies 104 and the redistribution layer 208 is disposed on the passivation layer 210. In some examples, the passivation layer 210 includes multiple layers such as a passivation layer 210-1 and a passivation layer 210-2. In some examples, the passivation layer 210-1 contacts the semiconductor dies 204 and the passivation layer 210-2 contacts the passivation layer 210-1.

The fan out package 202 includes a conductive spacer 206 coupled to the semiconductor dies 204. In some examples, the conductive spacer 206 is coupled to the semiconductor dies 204 via a sintering material 212. The conductive spacer 206 is coupled to the second surface 213 of the semiconductor dies 204. In some examples, the conductive spacer 206 is connected to a drain terminal (e.g., the drain terminal 105 of FIG. 1B) of each semiconductor die 204. In some examples, the conductive spacer 206 is coupled to the backside (e.g., the drain terminal) of the semiconductor dies 204. The conductive spacer 206 may enable the dies' backside to function as an electrode. The conductive spacer 206 includes a drain pad 230. The drain pad 230 may be a portion of a second surface 223 of the conductive spacer 206. In some examples, the drain pad 230 is the portion of the conductive spacer 206 that is exposed through an encapsulation material 214. In some examples, the drain pad 230 is a contact pad that is common to the semiconductor dies 204. The drain pad 230 is configured to be connected to an external component (e.g., external to the fan out package 202).

The conductive spacer 206 may be a unitary (single) body of conductive material that is coupled to each of the semiconductor dies 204. In some examples, the conductive spacer 206 is a single piece of metal that has been cut into desired dimensions. In some examples, the conductive spacer 206 includes a single conductive body with a rectangular shape. The conductive material includes a metal material such as copper or aluminum.

The conductive spacer 206 includes a first surface 221 and a second surface 223 opposite to the first surface 221. A distance between the first surface 221 and the second surface 223 defines the thickness of the conductive spacer 206 in the direction A1. In some examples, the thickness of the conductive spacer 206 is greater than the thickness of the semiconductor dies 204 in the direction A1. In some examples, the thickness of the conductive spacer 206 is greater than the thickness of the redistribution layer 208 in the direction A1. The conductive spacer 206 includes a first edge 217 and a second edge 219. The distance between the first edge 217 and the second edge 219 defines the length of the conductive spacer 206 in the direction A2. The edge 217 and the edge 219 may be opposing edges in the direction A2. The edge 217 and the edge 219 may extend between the first surface 211 and the second surface 213 in the direction A1.

The fan out package 202 includes an encapsulation material 214 coupled to the semiconductor dies 204 and the conductive spacer 206. For example, the encapsulation material 214 may contact the edge 207 of each semiconductor die 204 and the edge 209 of each semiconductor die 204. In some examples, the encapsulation material 214 extends along a length (e.g., the entire length) of the edge 207. In some examples, the encapsulation material 214 extends along a length (e.g., the entire length) of the edge 209. The encapsulation material 214 may contact the first edge 217 of the conductive spacer 206 and the second edge 219 of the conductive spacer 206. In some examples, the encapsulation material 214 extends along a length (e.g., the entire length) of the edge 217. In some examples, the encapsulation material 214 extends along a length (e.g., the entire length) of the edge 219.

Figure 3:
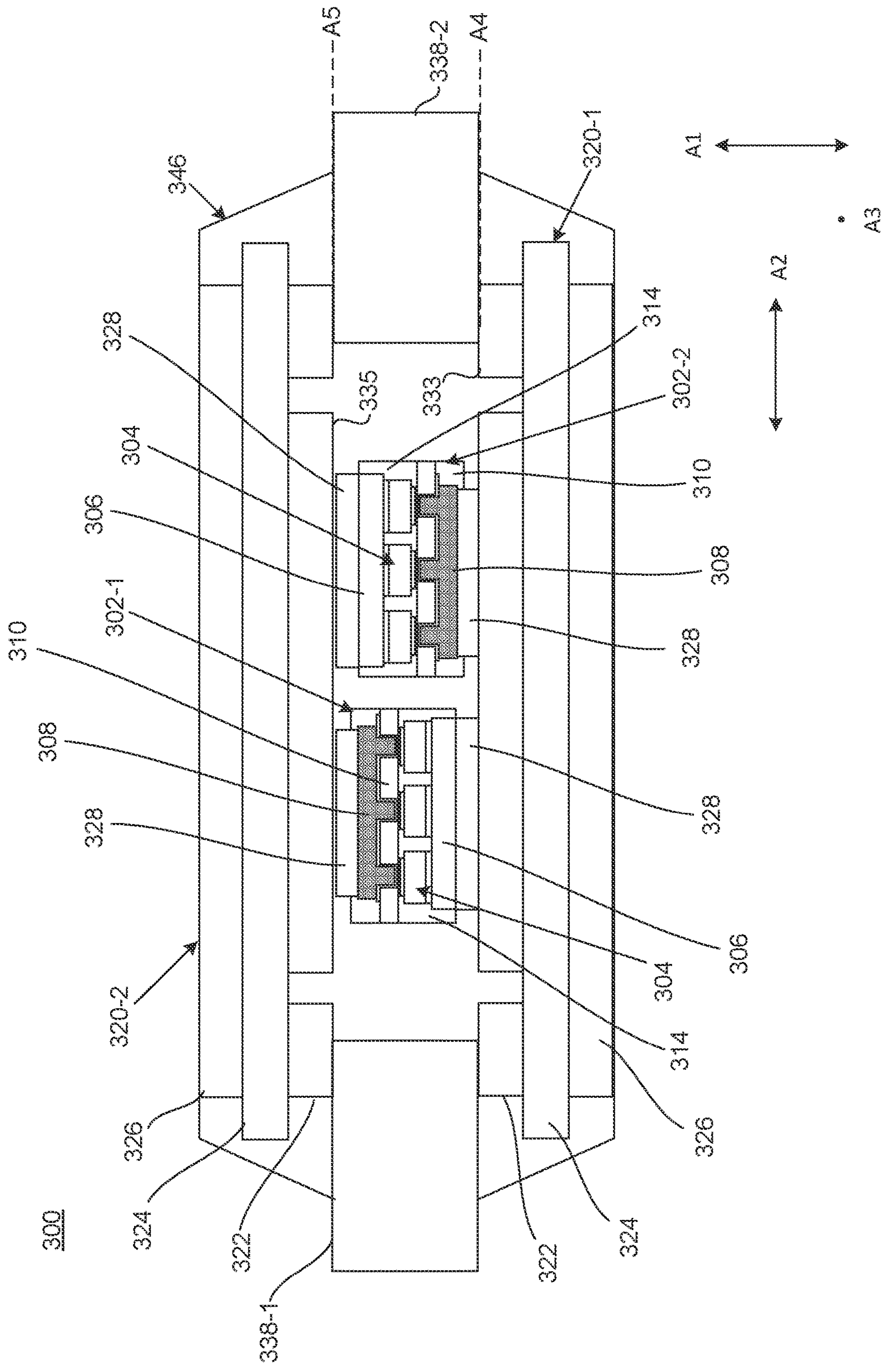
FIG. 3 illustrates a dual-side cooling power module with multiple fan out packages according to an aspect.

FIG. 3 illustrates an example of a power module 300. In some examples, the power module 300 includes a dual side cooling (DSC) power module. The power module 300 includes multiple fan out packages such as a fan out package 302-1 and a fan out package 302-1. The fan out package 302-1 and the fan out package 302-2 may be an example of the fan out package 102 of FIGS. 1A and 1B and/or the fan out package 202 of FIGS. 2A to 2E and may include any of the details discussed with reference to those figures. The power module 300 may include a substrate 320-1 (e.g., a direct bonded copper (DBC) substrate), a substrate 320-2 (e.g., DBC substrate), and the fan out packages 302-1, 302-2 disposed between and coupled to the substrate 320-1 and the substrate 320-2. In some examples, the power module 300 includes a lead frame portion 338-1 and a lead frame portion 338-2 disposed between and coupled to the substrate 320-1 and the substrate 320-2. The redistribution layer 308 of the fan out package 302-1 is coupled to the substrate 320-1, and the redistribution layer 308 of the fan out package 302-2 is coupled to the substrate 320-2 (e.g., one of the fan out packages is flipped with respect to the other fan out package).

The substrate 320-1 includes a dielectric layer 324. The dielectric layer 324 includes an insulating material. In some examples, the dielectric layer 324 includes a ceramic material. In some examples, the substrate 320-1 includes a single dielectric layer 324. In some examples, the substrate 320-1 includes multiple dielectric layers 324. In some examples, the substrate 320-1 includes a printed circuit board (PCB) substrate (e.g., a single layer of PCB or multiple layers of PCB). In some examples, the substrate 320-1 includes a conductive layer 322 coupled to one surface of the dielectric layer 324, and a conductive layer 326 coupled to the other surface of the dielectric layer 324. In some examples, the conductive layer 322 includes a copper layer. In some examples, the conductive layer 326 includes a copper layer. In some examples, the substrate 320-1 is a direct bonded metal (DBM) substrate (e.g., a substrate with a dielectric disposed between two metal layers) such as a direct bonded copper (DBC) substrate. The substrate 320-2 may be the same/similar as the substrate 320-1. For example, the substrate 320-2 also includes a dielectric layer 324, a conductive layer 322, and a conductive layer 326.

The conductive layer 322 of the substrate 320-1 includes an inner surface 333 aligned in a plane A4. The conductive layer 322 of the substrate 320-2 includes an inner surface 335 aligned in a plane A5. The plane A5 is disposed in parallel with the plane A4. A direction A1 is aligned perpendicular to the plane A4, and a direction A2 is perpendicular to the direction A1. A direction A3 into the page (shown as a dot in FIGS. 1A and 1B) is aligned parallel to the plane A4 and is orthogonal to directions A1 and A2.

The fan out package 302-1 and the fan out package 302-2 are coupled to and disposed between the substrate 320-1 and the substrate 320-2. The fan out package 302-1 includes semiconductor dies 304, a redistribution layer 308 coupled to the frontside (e.g., the source, gate) of the semiconductor dies 304, and a conductive spacer 306 coupled to the backside (e.g., the drain) of the semiconductor dies 304. Also, the fan out package 302-1 includes a passivation layer 310 applied to the backside of the semiconductor dies 304, and an encapsulation material 314 that contacts the semiconductor dies 304 and the conductive spacer 306.

The fan out package 302-2 includes semiconductor dies 304, a redistribution layer 308 coupled to the frontside (e.g., the source, gate) of the semiconductor dies 304, and a conductive spacer 306 coupled to the backside (e.g., the drain) of the semiconductor dies 304. Also, the fan out package 302-2 includes a passivation layer 310 applied to the backside of the semiconductor dies 304, and an encapsulation material 314 that contacts the semiconductor dies 304 and the conductive spacer 306.

The fan out package 302-1 may be coupled to the substrate 320-1 via an attachment layer 328, and the fan out package 302-1 may be coupled to the substrate 320-2 via an attachment layer 328. An attachment layer 328 may include a bonding material (e.g., solder, sinter, or other adhesives) that can bond conductive components together. The conductive spacer 306 of the fan out package 302-1 is coupled to the conductive layer 322 of the substrate 320-1 via an attachment layer 328. The redistribution layer 308 of the fan out package 302-1 is coupled to the conductive layer 322 of the substrate 320-2 via an attachment layer 328.

The fan out package 302-2 may be coupled to the substrate 320-1 via an attachment layer 328, and the fan out package 302-2 may be coupled to the substrate 320-2 via an attachment layer 328. The conductive spacer 306 of the fan out package 302-2 is coupled to the conductive layer 322 of the substrate 320-2 via an attachment layer 328. The redistribution layer 308 of the fan out package 302-2 is coupled to the conductive layer 322 of the substrate 320-1 via an attachment layer 328.

The lead frame portion 338-1 may be disposed between and coupled to the substrate 320-1 and the substrate 320-2. For example, the lead frame portion 338-1 is coupled to the conductive layer 322 of the substrate 320-1 and to the conductive layer 322 of the substrate 320-2. The lead frame portion 338-2 may be disposed between and coupled to the substrate 320-1 and the substrate 320-2. For example, the lead frame portion 338-2 is coupled to the conductive layer 322 of the substrate 320-1 and to the conductive layer 322 of the substrate 320-2. The fan out package 302-1 and the fan out package 302-2 are disposed between the lead frame portion 338-1 and the lead frame portion 338-2 in the direction A2.

The power module 300 includes an encapsulation material 346. The encapsulation material 346 may contact the edges of the substrate 320-1 and the edges of the substrate 320-2. The encapsulation material 346 may contact portions of the lead frame portion 338-1 and portions of the lead frame portion 338-2. Also, the encapsulation material 346 may contact the fan out package 302-1 and the fan out package 302-2.

Figure 4:
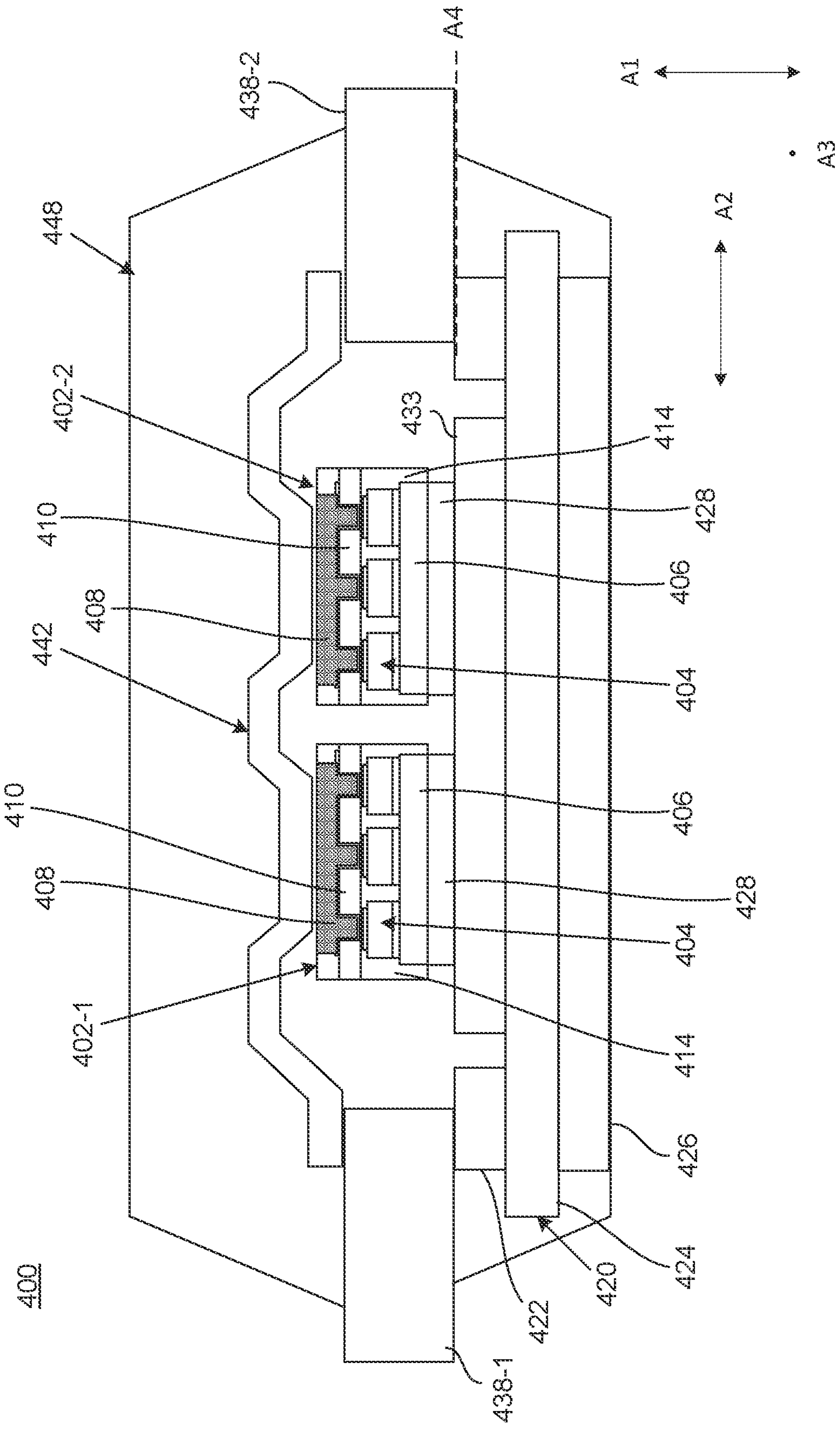
FIG. 4 illustrates a single side cooling power module with multiple fan out packages according to an aspect.
Figure 5A:
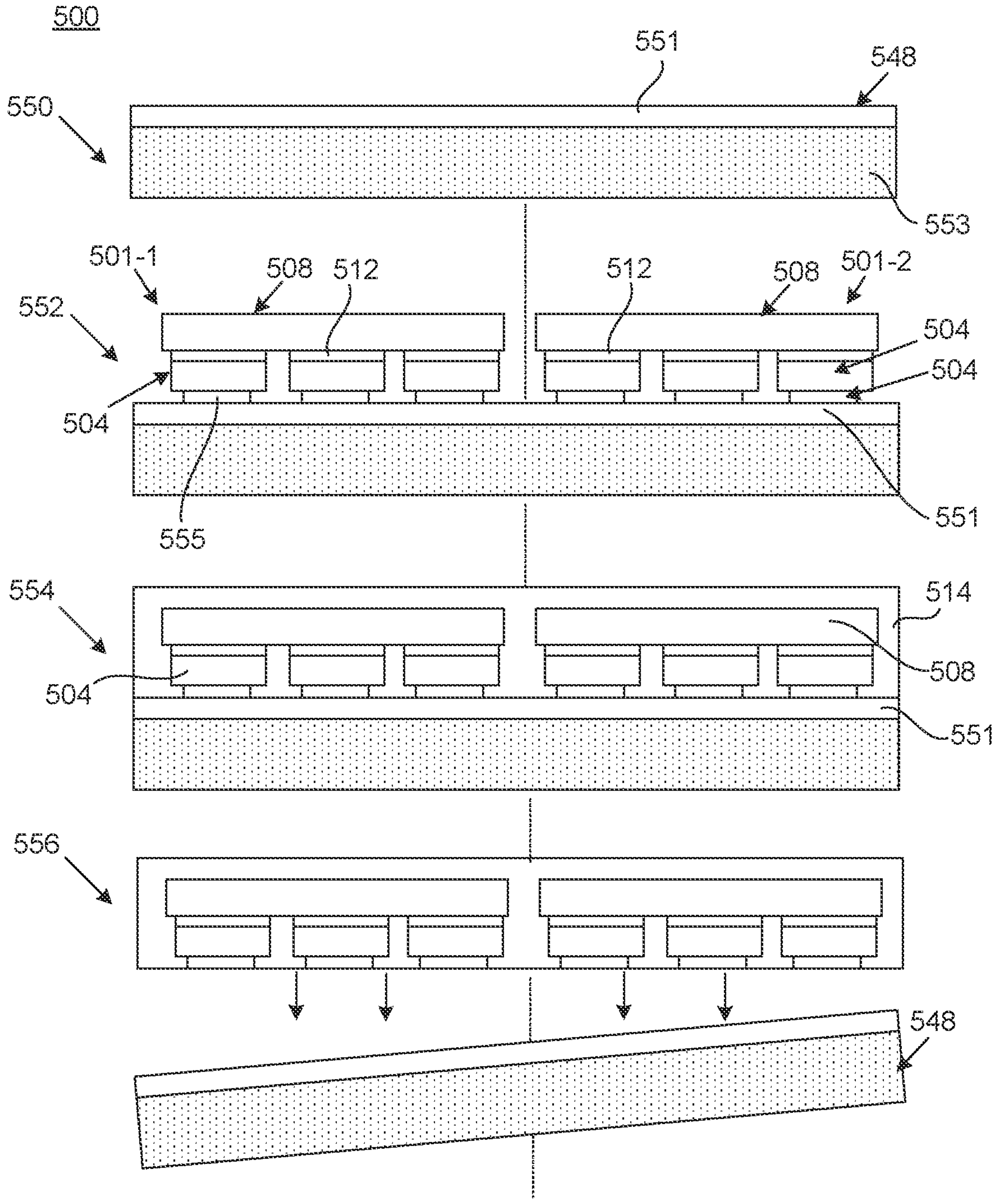
FIGS. 5A through 5D illustrate a manufacturing process of creating individual fan out packages according to an aspect.
Figure 5B:
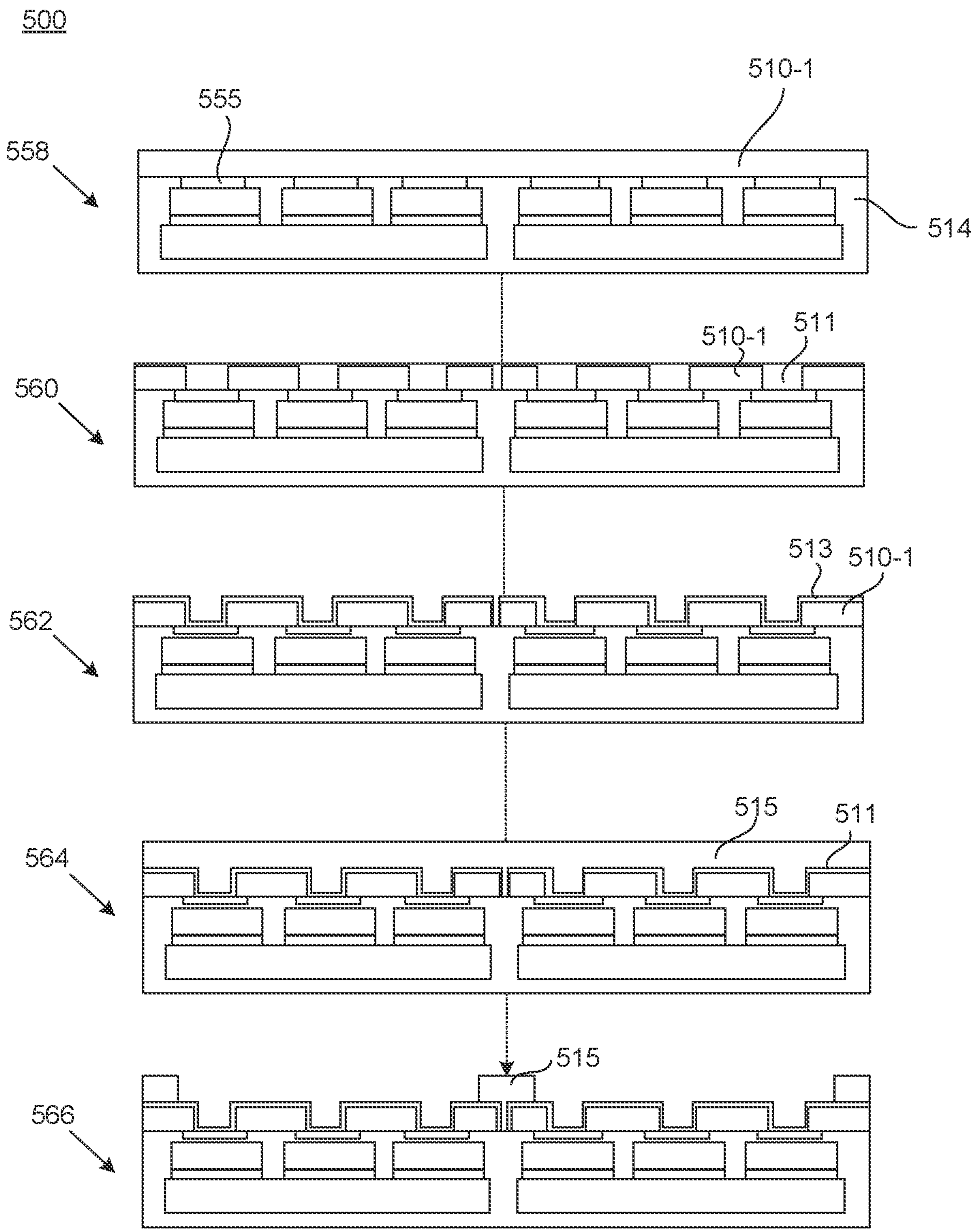
Figure 5C:
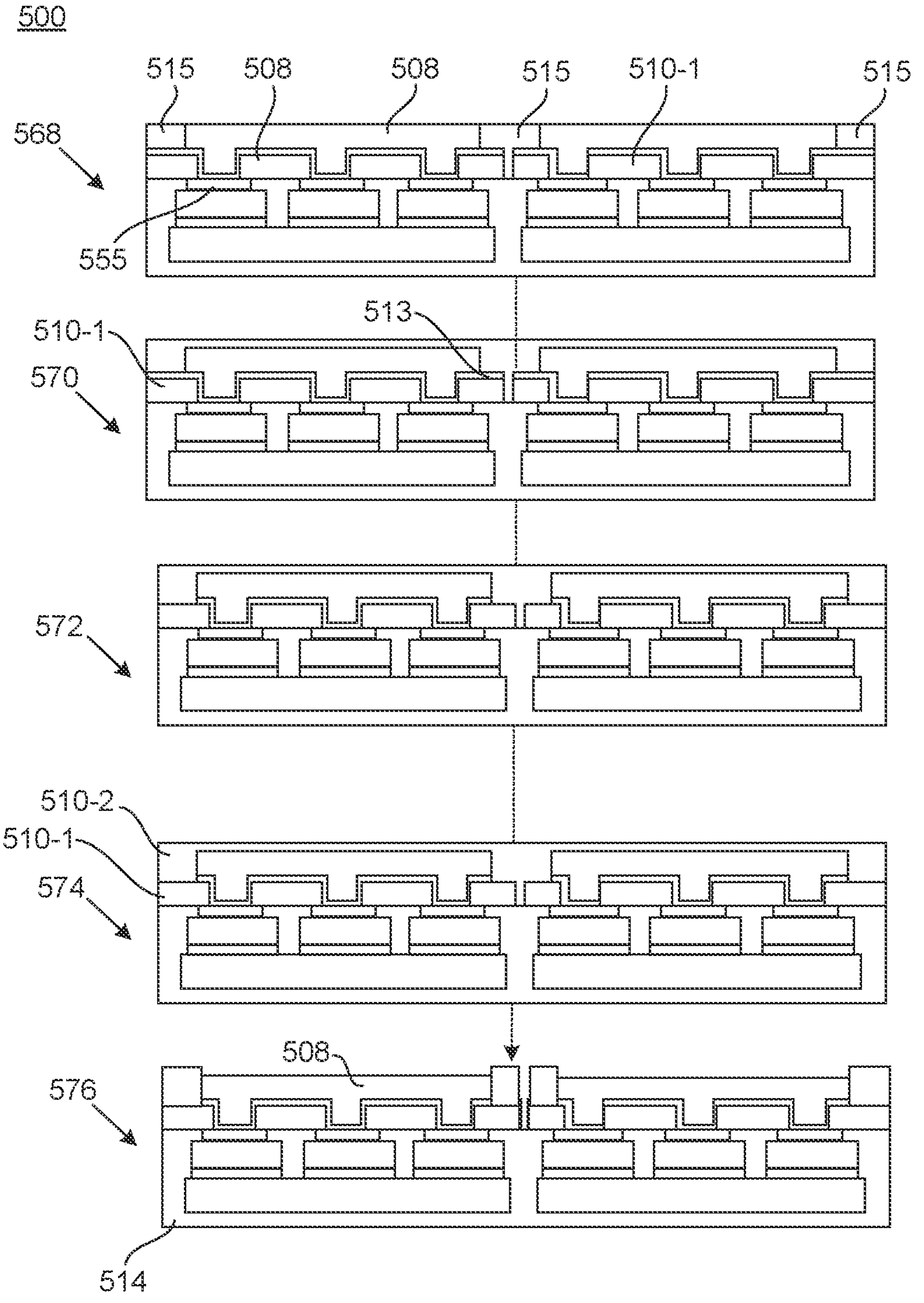
Figure 5D:
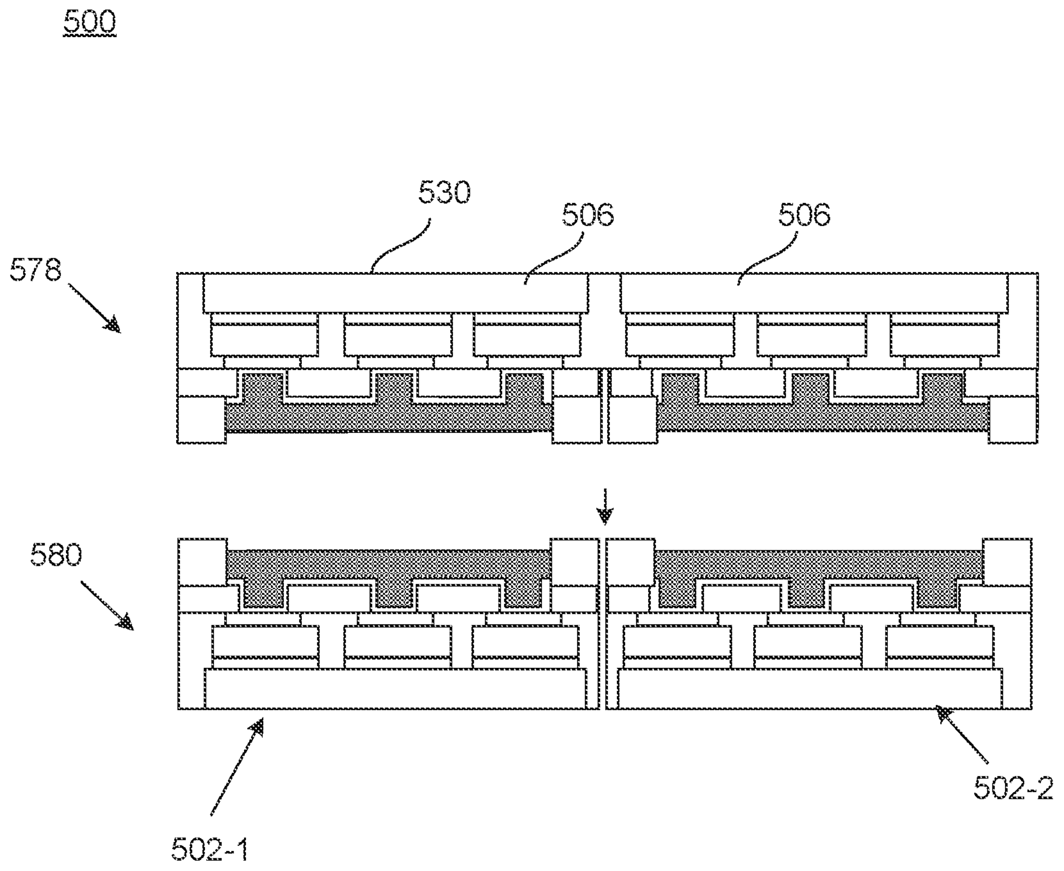

FIG. 4 illustrates an example of a power module 400. In some examples, the power module 400 includes a single side cooling (DSC) power module. The power module 400 includes multiple fan out packages such as a fan out package 402-1 and a fan out package 402-1. The fan out package 402-1 and the fan out package 402-2 may be an example of the fan out package 102 of FIGS. 1A and 1B and/or the fan out package 202 of FIGS. 2A to 2E and may include any of the details discussed with reference to those figures.

The power module 400 may include a substrate 420 (e.g., a direct bonded copper (DBC) substrate), a clip member 442, and the fan out packages 402-1, 402-2 disposed between and coupled to the substrate 420 and the clip member 442. In some examples, the power module 400 includes a lead frame portion 438-1 and a lead frame portion 438-2 disposed between and coupled to the substrate 420 and the clip member 442. The conductive spacer 406 of the fan out package 402-1 is coupled to the substrate 420, and the conductive spacer 406 of the fan out package 402-2 is coupled to the substrate 420 (e.g., the fan out packages 402-1, 402-2 have the same orientation).

The substrate 420 includes a dielectric layer 424. The dielectric layer 424 includes an insulating material. In some examples, the dielectric layer 424 includes a ceramic material. In some examples, the substrate 420 includes a single dielectric layer 424. In some examples, the substrate 420 includes multiple dielectric layers 424. In some examples, the substrate 420 includes a printed circuit board (PCB) substrate (e.g., a single layer of PCB or multiple layers of PCB). In some examples, the substrate 420 includes a conductive layer 422 coupled to one surface of the dielectric layer 424, and a conductive layer 426 coupled to the other surface of the dielectric layer 424. In some examples, the conductive layer 422 includes a copper layer. In some examples, the conductive layer 426 includes a copper layer. In some examples, the substrate 420 is a direct bonded metal (DBM) substrate (e.g., a substrate with a dielectric disposed between two metal layers) such as a direct bonded copper (DBC) substrate. The conductive layer 422 of the substrate 420 includes an inner surface 433 aligned in a plane A4. A direction A1 is aligned perpendicular to the plane A4, and a direction A2 is perpendicular to the direction A1. A direction A3 into the page (shown as a dot in FIGS. 1A and 1B) is aligned parallel to the plane A4 and is orthogonal to directions A1 and A2.

The clip member 442 includes a conductive material. In some examples, the clip member 442 may include portions that extend in the direction A1 and the direction A2. In some examples, the clip member 442 includes portions that are disposed in parallel with each at multiple planes in the direction A2. In some examples, the clip member 442 includes portions disposed at an angle (e.g., a non-zero, non-perpendicular angle) with respect to each other. The fan out package 402-1 and the fan out package 402-2 are coupled to and disposed between the substrate 420 and the clip member 442.

The fan out package 402-1 includes semiconductor dies 404, a redistribution layer 408 coupled to the frontside (e.g., the source, gate) of the semiconductor dies 404, and a conductive spacer 406 coupled to the backside (e.g., the drain) of the semiconductor dies 404. Also, the fan out package 402-1 includes a passivation layer 410 applied to the backside of the semiconductor dies 404, and an encapsulation material 414 that contacts the semiconductor dies 404 and the conductive spacer 406.

The fan out package 402-2 includes semiconductor dies 404, a redistribution layer 408 coupled to the frontside (e.g., the source, gate) of the semiconductor dies 404, and a conductive spacer 406 coupled to the backside (e.g., the drain) of the semiconductor dies 404. Also, the fan out package 402-2 includes a passivation layer 410 applied to the backside of the semiconductor dies 404, and an encapsulation material 414 that contacts the semiconductor dies 404 and the conductive spacer 406.

The fan out package 402-1 may be coupled to the substrate 420 via an attachment layer 428, and the fan out package 402-2 may contact (e.g., directly contact) the clip member 442. An attachment layer 428 may include a bonding material (e.g., solder, sinter, or other adhesives) that can bond conductive components together. The conductive spacer 406 of the fan out package 402-1 is coupled to the conductive layer 422 of the substrate 420 via an attachment layer 428. The redistribution layer 408 of the fan out package 402-1 contacts the clip member 442. The fan out package 402-2 may be coupled to the substrate 420 via an attachment layer 428, and the fan out package 402-2 may contact the clip member 442. The conductive spacer 406 of the fan out package 402-2 is coupled to the conductive layer 422 of the substrate 420 via an attachment layer 428. The redistribution layer 408 of the fan out package 402-2 contacts the clip member 442.

The lead frame portion 438-1 may be disposed between and coupled to the substrate 420 and the clip member 442. For example, the lead frame portion 438-1 is coupled to the conductive layer 422 of the substrate 420 and to the clip member 442. The lead frame portion 438-2 may be disposed between and coupled to the substrate 420 and the clip member 442. For example, the lead frame portion 438-2 is coupled to the conductive layer 422 of the substrate 420 and to the clip member 442. The fan out package 402-1 and the fan out package 402-2 are disposed between the lead frame portion 438-1 and the lead frame portion 438-2 in the direction A2. The power module 400 includes an encapsulation material 448. The encapsulation material 448 may contact portions of the substrate 420 and the clip member 442. The encapsulation material 448 may contact portions of the lead frame portion 438-1 and portions of the lead frame portion 438-2. Also, the encapsulation material 448 may contact the fan out package 402-1 and the fan out package 402-2.

FIGS. 5A through 5D illustrate a manufacturing process 500 for creating individual fan out packages (e.g., fan out package 502-1, fan out package 502-2). The fan out package 502-1 and the fan out package 502-2 may be an example of the fan out package 102 of FIGS. 1A and 1B, the fan out package 202 of FIGS. 2A through 2E, the fan out packages of FIG. 3, and/or the fan out packages of FIG. 4 and may include any of the details discussed with reference to those figures.

Operation 550 includes providing a carrier assembly 548 including a carrier 553 and a film 551 coupled to a surface of the carrier 553. Operation 552 includes a pick and pace operation (e.g., die reconstitution) that attaches a die assembly 501-1 and a die assembly 501-2 to the carrier assembly 548. The die assembly 501-1 includes a plurality of semiconductor dies 504, a conductive pad 555 coupled to each semiconductor die 504, and a conductive spacer 506 coupled to the semiconductor dies 504 via a sintering material 512. The die assembly 501-2 includes a plurality of semiconductor dies 504, a conductive pad 555 coupled to each semiconductor die 504, and a conductive spacer 506 coupled to the semiconductor dies 504 via a sintering material 512. The conductive pads 555 are coupled to the film 551.

Operation 554 includes applying an encapsulation material 514 to the die assembly 501-1, the die assembly 501-2, and the carrier assembly 548. Operation 556 includes removing the carrier assembly 548 from the encapsulation material 514, the die assembly 501-1 and the die assembly 501-2. Operation 558 includes applying a passivation layer 510-1 to the conductive pads 555 and the encapsulation material 514. Operation 560 includes removing portions of the passivation layer 510-1 to create gaps 511. Operation 562 includes applying a sputter operation to apply sputter metallization 513 to the passivation layer 510-1. Operation 564 includes applying a photoresist material 515 to the sputter metallization 513 on the passivation layer 510-1. Operation 566 includes removing portions of the photoresist material 515.

Operation 568 includes applying metal plating to form a redistribution layer 508 on the conductive pads 555 and the passivation layer 510-1. Operation 570 includes removing the photoresist material 515. Operation 572 includes a wet etch operation to remove portions of the sputter metallization 513 on the passivation layer 510-1. Operation 574 includes applying a passivation layer 510-2 to the passivation layer 510-1. Operation 576 includes removing portions of the passivation layer 510-2 on top of the redistribution layer 508. Operation 578 includes removing a portion of the encapsulation material 514 to expose the top surface of the conductive spacer 506, thereby creating a source contact pad 530. Operation 580 includes a singulation process to separate the fan out packages, e.g., the fan out package 502-1 and the fan out package 502-2.

Figure 6A:
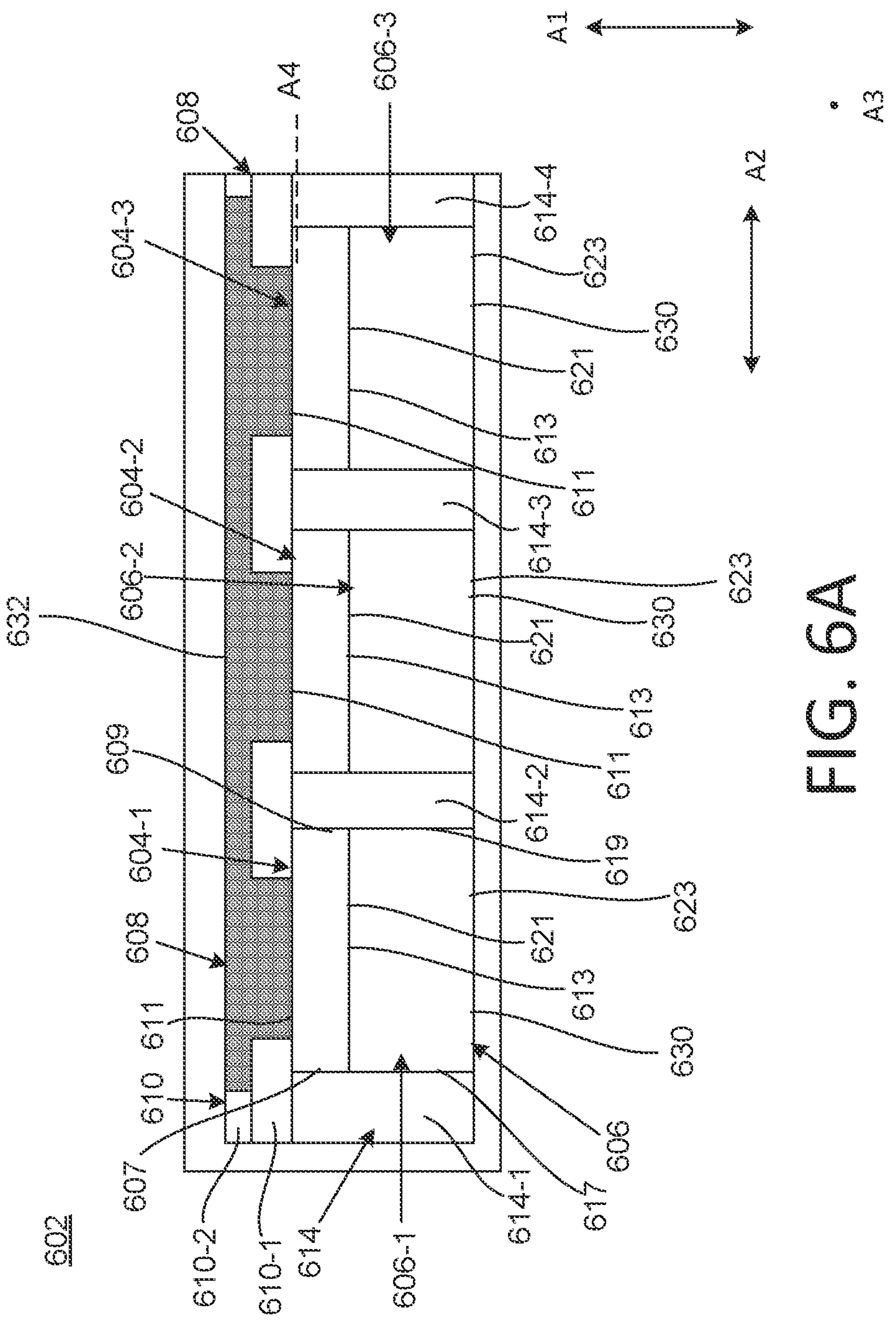
FIG. 6A illustrates a fan out package with conductive plates according to an aspect.
Figure 6B:
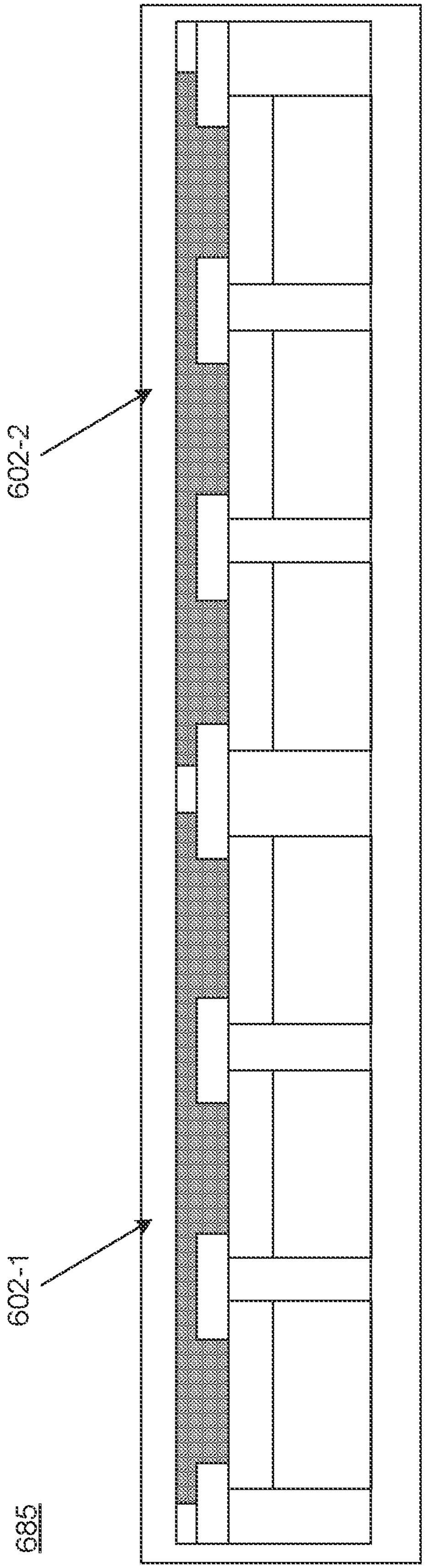
FIG. 6B illustrates a fan out package assembly with multiple fan out packages according to an aspect.
Figure 6C:
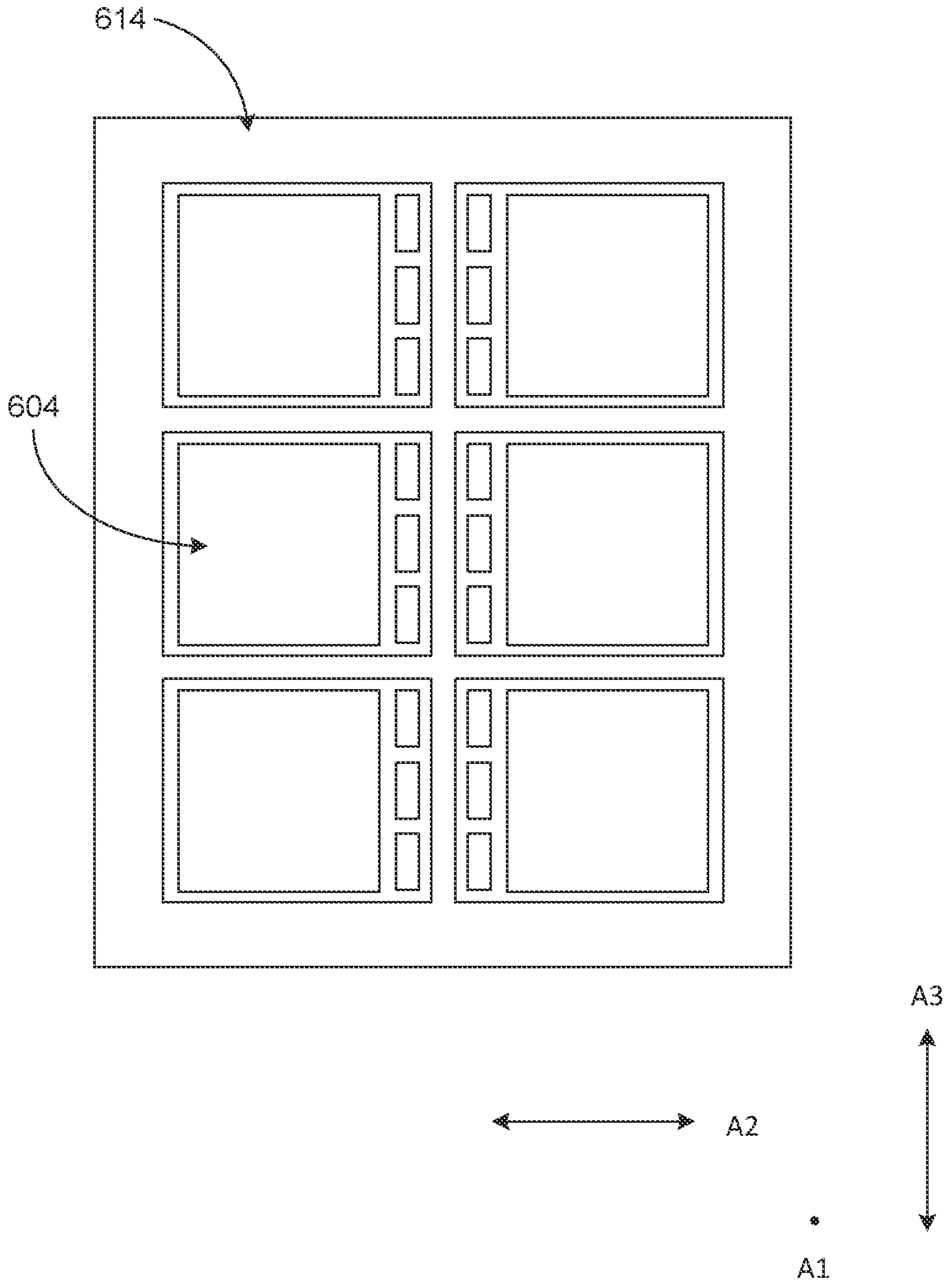
FIG. 6C illustrates a package construction view of the fan out package assembly according to an aspect.
Figure 6E:
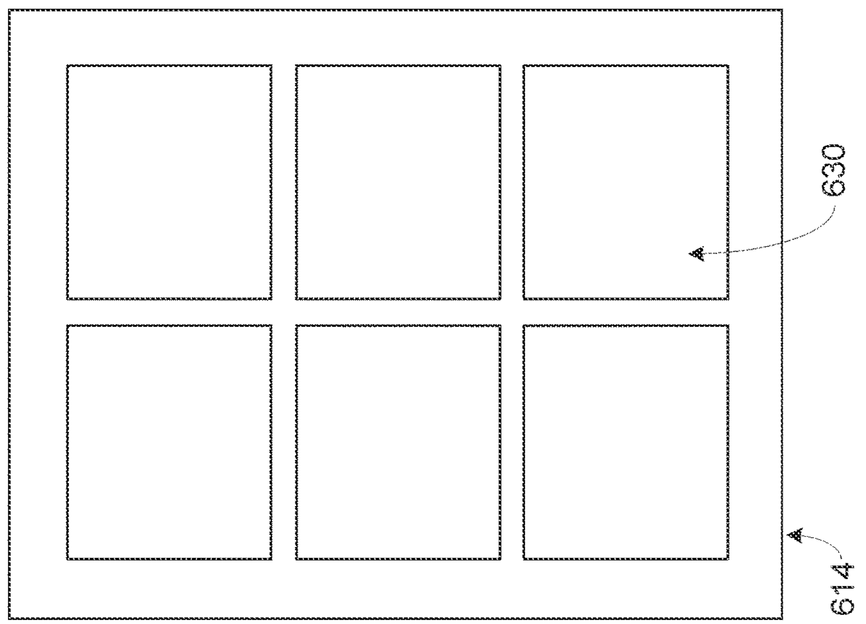
FIG. 6E illustrates a bottom view of the fan out package assembly according to an aspect.
Figure 6D:
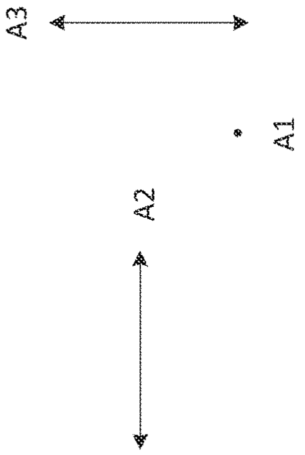
FIG. 6D illustrates a top view of the fan out package assembly according to an aspect.
Figure 6D:
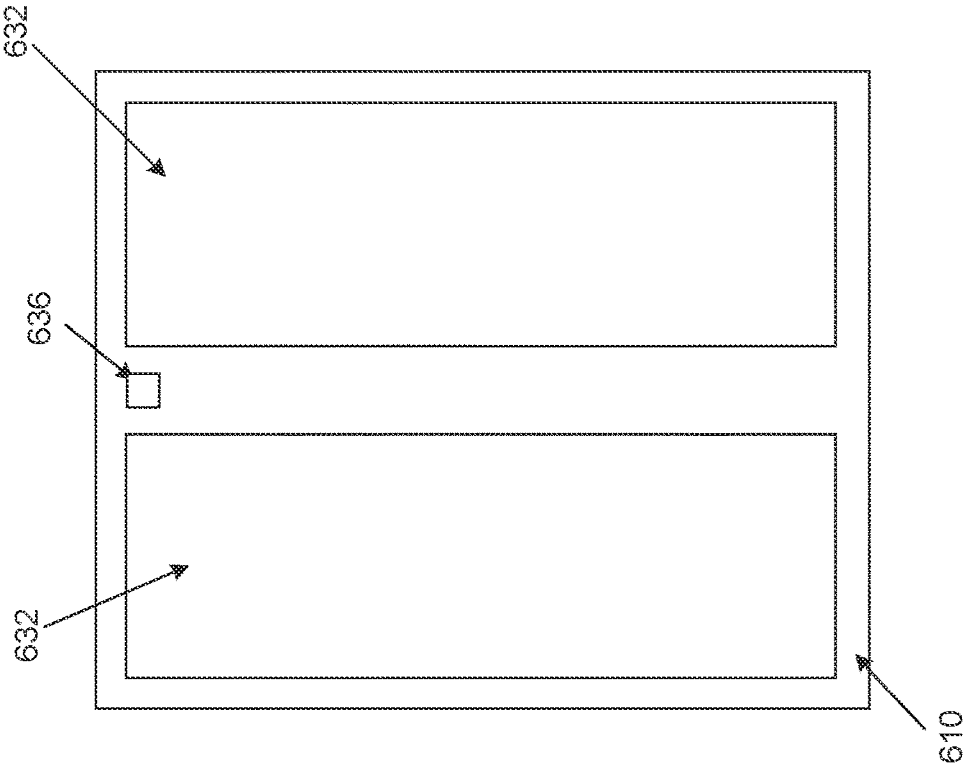

FIGS. 6A to 6E illustrate a fan out package 602 according to an aspect. FIG. 6A illustrates a side view of a single fan out package 602 according to an aspect. FIGS. 6B to 6E illustrate various views of a fan out package assembly 685 with multiple fan out packages 602. FIG. 6B illustrates a side view of a fan out package assembly 685 with two fan out packages 602 (e.g., before the fan out packages 602 are separated during the manufacturing process). As shown in FIG. 6B, the fan out package assembly 685 includes a first fan out package 602-1 and a second fan out package 602-2. The second fan out package 602-2 is the same as the first fan out package 602-1. FIG. 6C illustrates a package construction view of the fan out package assembly 685. FIG. 6D illustrates a top view of the fan out package assembly 685 depicting source pads 632 and a gate pad 636. FIG. 6E illustrates a bottom view of the fan out package assembly 685 depicting drain pads 630.

The fan out package 602 may be an example of the fan out package 102 of FIGS. 1A and 1B and may include any of the details discussed with reference to those figures. The fan out package 602 may be a subcomponent within a larger power module. In some examples, the fan out package 602 is included in a single side cooling (SSC) power module or a dual side cooling (DSC) power module. In some examples, the fan out package 602 enables the backside of semiconductor dies 604 to function as an electrode.

Referring to FIG. 6A, the fan out package 602 includes a plurality of semiconductor dies 604. The semiconductor dies 604 are power semiconductor dies. The semiconductor dies 604 may include a semiconductor die 604-1, a semiconductor die 604-2, and a semiconductor die 604-3. Although three semiconductor dies 604 are depicted in FIGS. 6A to 6E, the number of semiconductor dies 604 may be two or any number greater than three such as four, five, six, seven, eight, etc. In some examples, the fan out package 602 includes three or more semiconductor dies 604.

Each semiconductor die 604 includes a first surface 611 (e.g., a top surface) and a second surface 613 (e.g., a bottom surface). The second surface 613 may be disposed in parallel with the first surface 611. The distance between the first surface 611 and the second surface 613 may define the thickness of the semiconductor die 604 in the direction A1. In some examples, the first surface 611 of each semiconductor die 604 are aligned with each other in the direction A1. The first surface 611 is aligned in a plane A4. A direction A1 is aligned perpendicular to the plane A4, and a direction A2 is perpendicular to the direction A1. A direction A3 into the page is aligned parallel to the plane A4 and is orthogonal to directions A1 and A2. Each semiconductor die 204 includes a first edge 607 and a second edge 609. The distance between the first edge 607 and the second edge 609 defines the length of the semiconductor die 604 in the direction A2. The edge 607 and the edge 609 may extend between the first surface 611 and the second surface 613 in the direction A1.

The fan out package 602 includes a redistribution layer 608 coupled to the semiconductor dies 604. The redistribution layer 608 includes a metal layer (e.g., patterned metallization) that redistributes current. The redistribution layer 608 is coupled to the first surface 611 of each semiconductor die 604. In some examples, the redistribution layer 608 is connected to a source terminal of each semiconductor die 604. The redistribution layer 608 includes a source pad 632 on the outer surface of the redistribution layer 608. In some examples, the source pad 632 is a contact pad that is common to the semiconductor dies 604. The source pad 632 is configured to be connected to an external component (e.g., external to the fan out package 602).

The fan out package 602 includes a passivation layer 610 coupled to the first surface 611 of the semiconductor dies 604. A passivation layer 610 may include material silicon dioxide (SiO2), silicon nitride (Si3N4), and/or titanium dioxide (TiO2). In some examples, the passivation layer 610 is aligned in plane (in the direction A1) that is the same as the redistribution layer 608. In some examples, the passivation layer 610 is disposed on the semiconductor dies 604 and the redistribution layer 608 is disposed on the passivation layer 610. In some examples, the passivation layer 610 includes multiple layers such as a passivation layer 610-1 and a passivation layer 610-2. In some examples, the passivation layer 610-1 contacts the semiconductor dies 604 and the passivation layer 610-2 contacts the passivation layer 610-1.

The fan out package 602 includes a plurality of conductive plates 606. The conductive plates 606 include a conductive plate 606-1 coupled to the surface 613 of the semiconductor die 604-1, a conductive plate 606-2 coupled to the surface 613 of the semiconductor die 604-2, and a conductive plate 606-3 coupled to the surface 613 of the semiconductor die 604-3. In some examples, a conductive plate 606 is connected to a drain terminal (e.g., the drain terminal 105 of FIG. 1B) of a respective semiconductor die 604. In some examples, the conductive plates 606 are coupled to the backside (e.g., the drain terminal) of the semiconductor dies 604. The conductive plates 606 may enable the dies' backside to function as an electrode. Each conductive plate 606 may include a drain pad 630. In some examples, a drain pad 630 is a surface 623 of a conductive plate 606. In some examples, a drain pad 630 is the portion of a conductive plate 606 that is exposed through an encapsulation material 614. In some examples, the drain pad 630 is a contact pad that is associated with a semiconductor die 604 (e.g. not shared among the dies). The drain pads 630 are configured to be connected to an external component (e.g., external to the fan out package 602).

Each conductive plate 606 includes a first surface 621 and a second surface 623. A distance between the first surface 621 and the second surface 623 defines the thickness of the conductive plate 606 in the direction A1. In some examples, the thickness of a conductive plate 606 is greater than the thickness of the semiconductor dies 604 in the direction A1. In some examples, the thickness of the conductive plate 606 is greater than the thickness of the redistribution layer 608 in the direction A1. Each conductive plate 606 includes a first edge 617 and a second edge 619. The distance between the first edge 617 and the second edge 619 defines the length of the conductive plate in the direction A2. The edge 617 and the edge 619 may be opposing edges in the direction A2. The edge 617 and the edge 619 may extend between the first surface 611 and the second surface 613 in the direction A1.

The fan out package 602 includes an encapsulation material 614 coupled to the semiconductor dies 604 and the conductive plates 606. For example, the encapsulation material 614 may contact the edge 607 of each semiconductor die 604 and the edge 609 of each semiconductor die 604. In some examples, the encapsulation material 614 extends along a length (e.g., the entire length) of the edge 607. In some examples, the encapsulation material 614 extends along a length (e.g., the entire length) of the edge 609. The encapsulation material 214 may contact the first edge 617 of a conductive plate 606 and the second edge 619 of the conductive plate 606. In some examples, the encapsulation material 614 extends along a length (e.g., the entire length) of the edge 617. In some examples, the encapsulation material 614 extends along a length (e.g., the entire length) of the edge 619. In some examples, the encapsulation material 614 includes a portion 614-1 that extends from an edge 607 of the semiconductor die 604-1 to an edge of the fan out package 602 in the direction A2.

In some examples, the encapsulation material 614 includes a portion 614-2 disposed between the conductive plate 606-1 and the conductive plate 606-2 (and between the semiconductor die 604-1 and the semiconductor die 604-2) in the direction A2. In some examples, the encapsulation material 614 includes a portion 614-3 disposed between the conductive plate 606-2 and the conductive plate 606-3 (and between the semiconductor die 604-2 and the semiconductor die 604-3) in the direction A2. In some examples, the encapsulation material 614 includes a portion 614-4 that extends from an edge 609 of the semiconductor die 604-3 to an edge of the fan out package 602 in the direction A2.

Figure 7A:
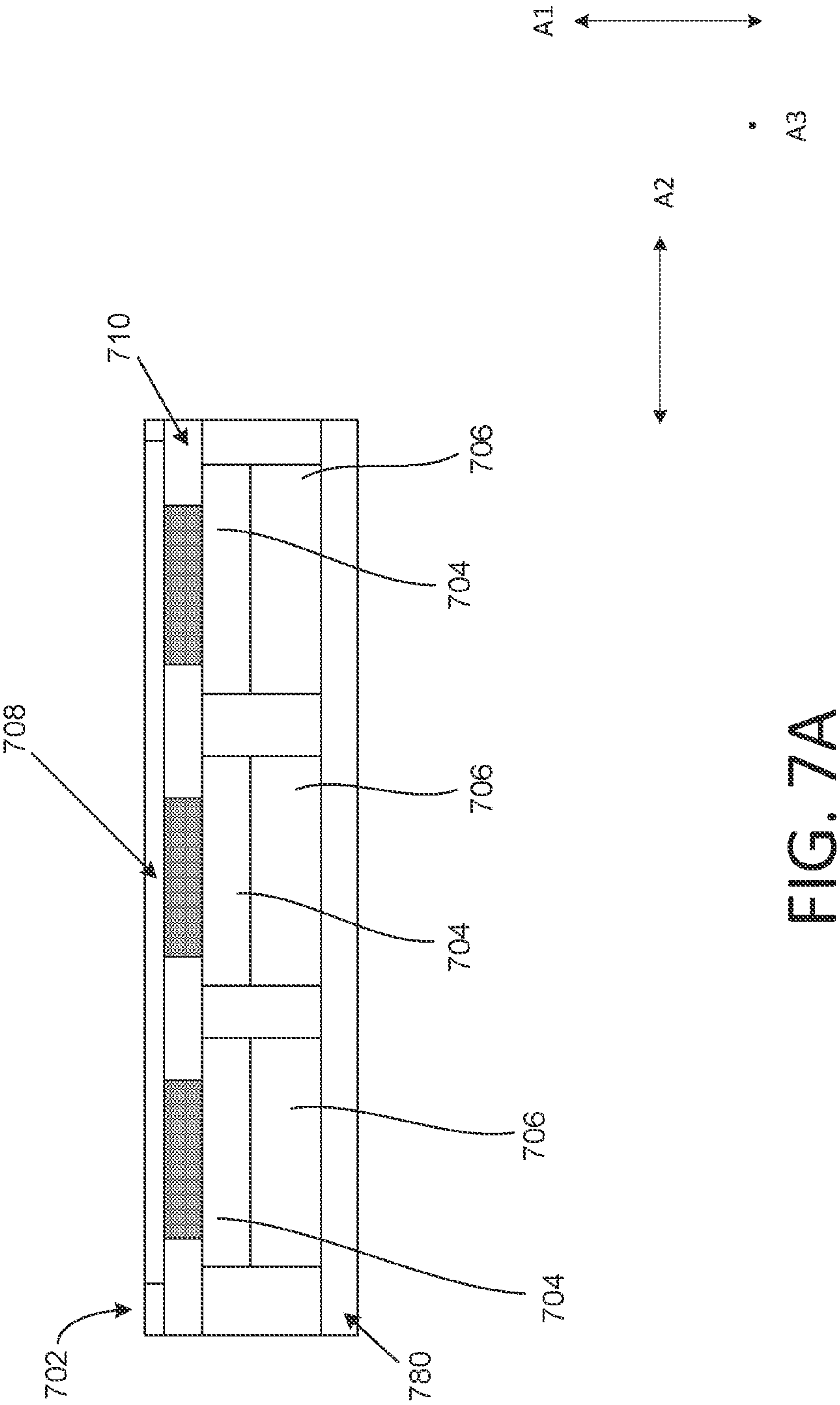
FIG. 7A illustrates a fan out package with conductive plates and a conductive layer coupled to the conductive plates according to an aspect.
Figure 7B:
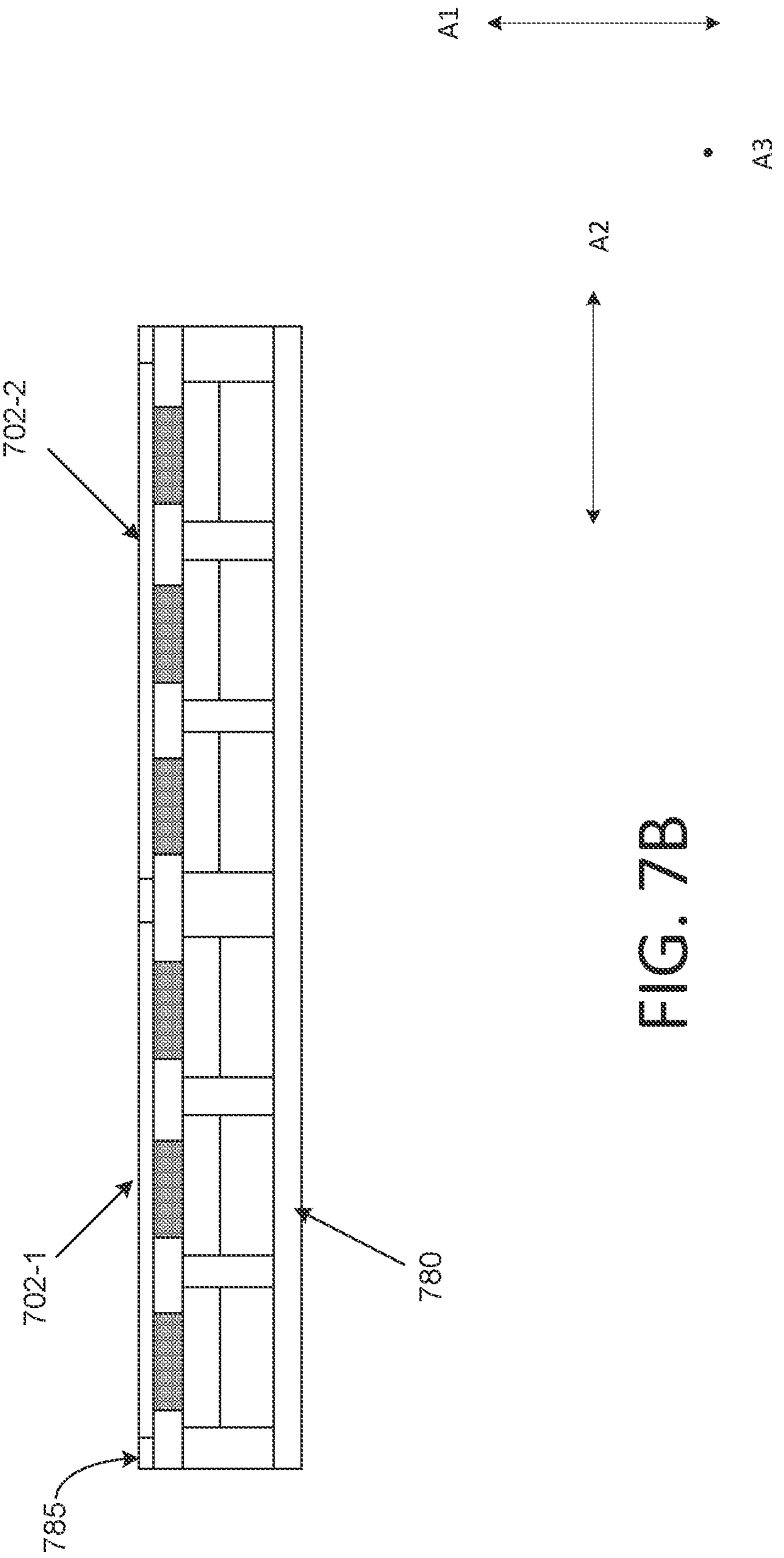
FIG. 7B illustrates a fan out package assembly with multiple fan out packages according to an aspect.
Figure 7C:
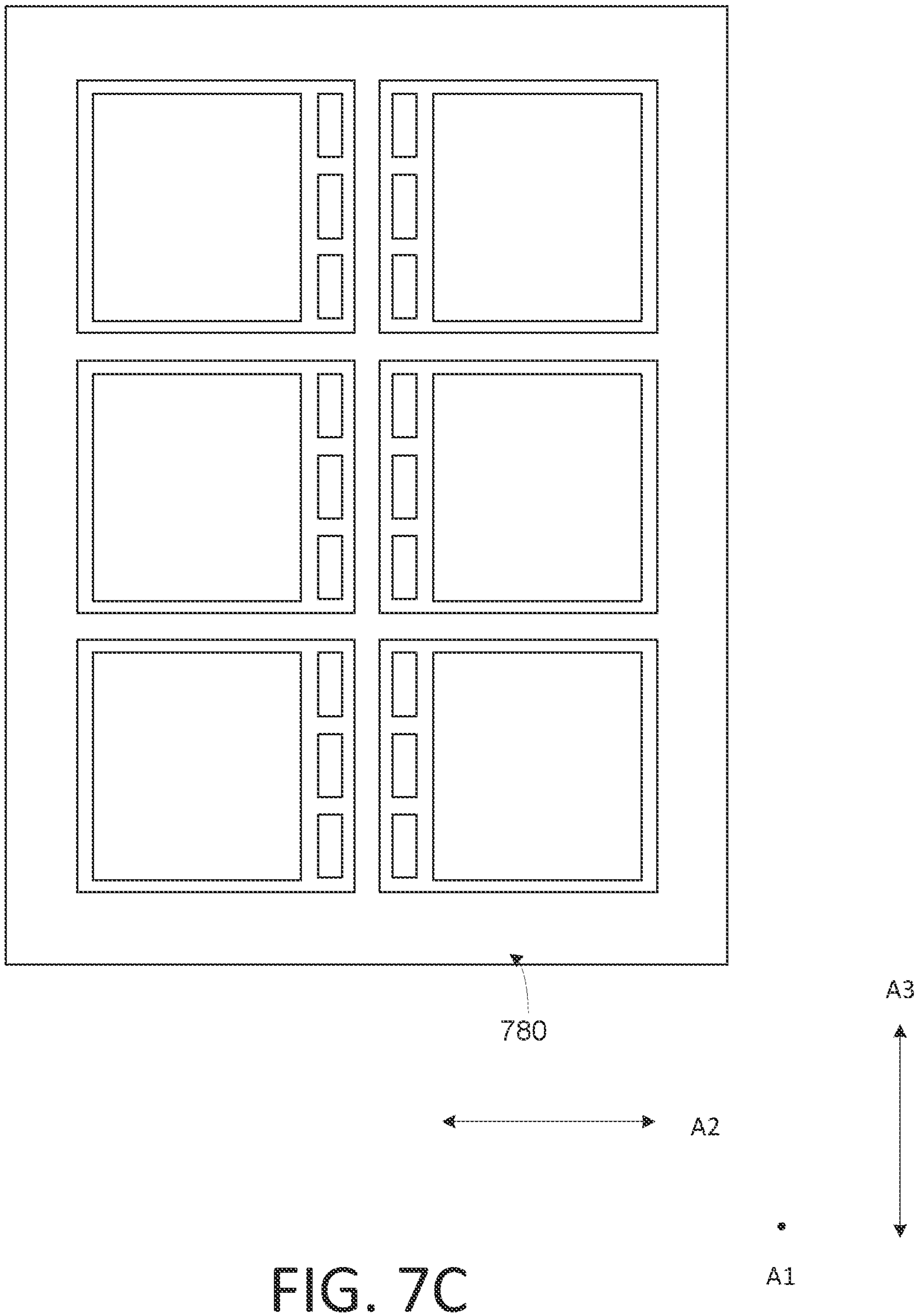
FIG. 7C illustrates a package construction view of the fan out package assembly according to an aspect.
Figure 7E:
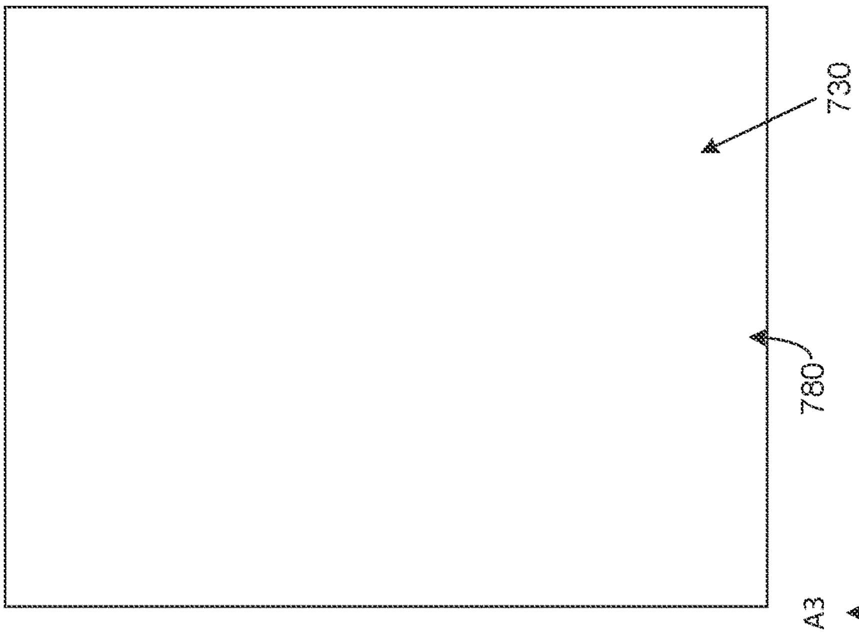
FIG. 7E illustrates a bottom view of the fan out package assembly according to an aspect.
Figure 7D:
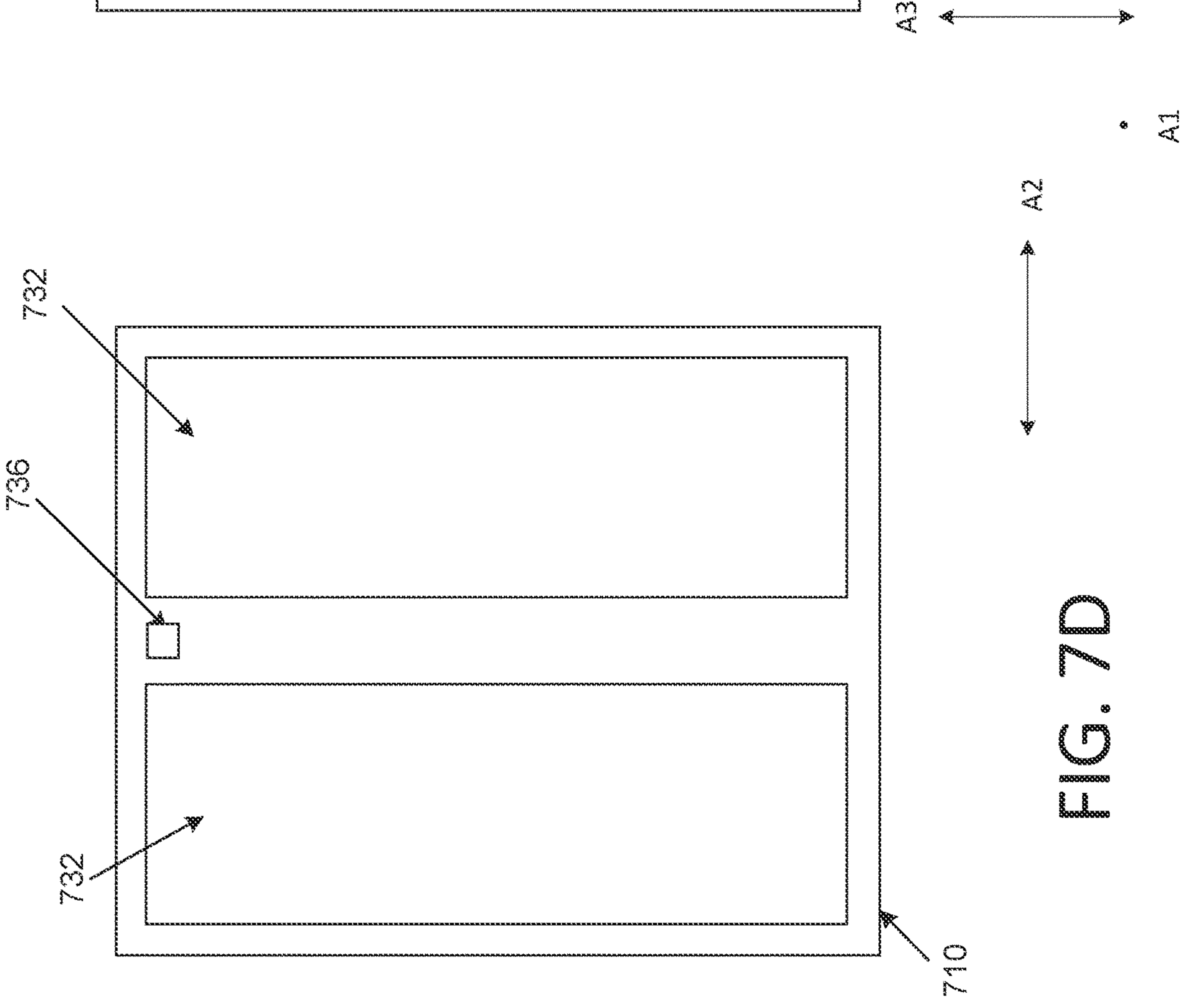
FIG. 7D illustrates a top view of the fan out package assembly according to an aspect.

FIGS. 7A to 7E illustrate a fan out package 702 according to an aspect. FIG. 7A illustrates a side view of a single fan out package 702 according to an aspect. FIGS. 7B to 7E illustrate various views of a fan out package assembly 785 with multiple fan out packages 702. FIG. 7B illustrates a side view of a fan out package assembly 785 with two fan out packages 702 (e.g., before the fan out packages 702 are separated during the manufacturing process). As shown in FIG. 7B, the fan out package assembly 785 includes a first fan out package 702-1 and a second fan out package 702-2. The second fan out package 702-2 is the same as the first fan out package 702-1. FIG. 7C illustrates a package construction view of the fan out package assembly 685. FIG. 7D illustrates a top view of the fan out package assembly 785 depicting source pads 732 and a gate pad 736. FIG. 7E illustrates a bottom view of the fan out package assembly 785 depicting a single relatively large drain pad 730 provided by the exposed conductive layer 780.

The fan out package 702 may be an example of the fan out package 102 of FIGS. 1A and 1B and the fan out package 602 of FIGS. 6A to 6E and may include any of the details discussed with reference to those figures. The fan out package 702 may be a subcomponent within a larger power module. In some examples, the fan out package 702 is included in a single side cooling (SSC) power module or a dual side cooling (DSC) power module. In some examples, the fan out package 702 enables the backside of semiconductor dies 704 to function as an electrode.

The fan out package 702 may be the same as the fan out package 602 except that the fan out package 702 includes a conductive layer 780 coupled to the conductive plates 706. For example, the fan out package 702 includes a plurality of semiconductor dies 705, a plurality of conductive plates 706 coupled to the backside of the semiconductor dies 704, and a redistribution layer 708 coupled to the front-side of the semiconductor dies 704. The fan out package 702 also includes a passivation layer 710 coupled to the front-side of the semiconductor dies 704. The conductive layer 780 may function as a drain contact paid that is common to the plurality of semiconductor dies 704.

Figure 8:
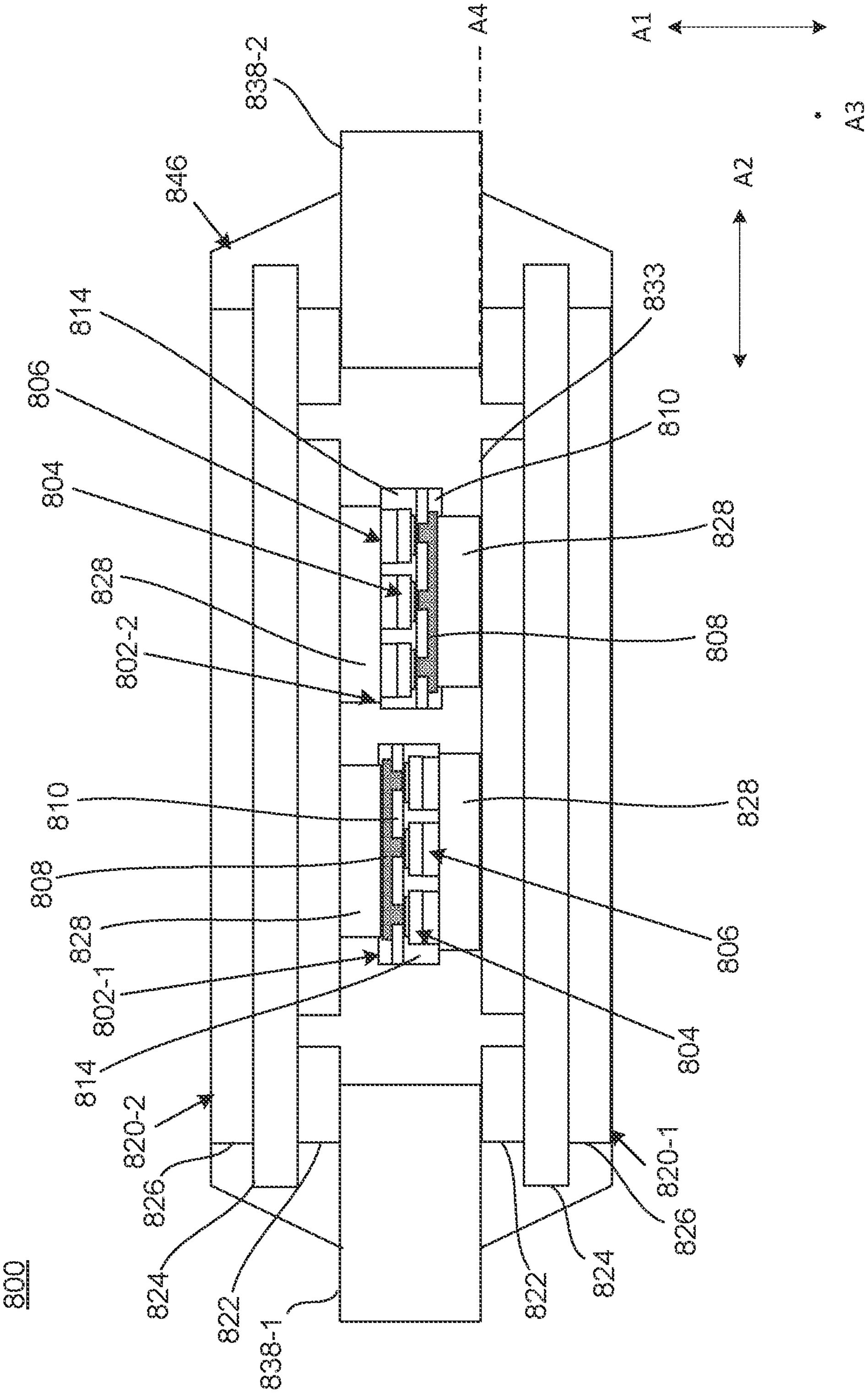
FIG. 8 illustrates a dual-side cooling power module with multiple fan out packages according to an aspect.

FIG. 8 illustrates an example of a power module 800. In some examples, the power module 800 includes a dual side cooling (DSC) power module. The power module 800 includes multiple fan out packages such as a fan out package 802-1 and a fan out package 802-1. The fan out package 802-1 and the fan out package 802-2 may be an example of the fan out package 102 of FIGS. 1A and 1B, the fan out package 602 of FIGS. 6A to 6E and/or the fan out package 702 of FIGS. 7A to 7E and may include any of the details discussed with reference to those figures.

The power module 800 may include a substrate 820-1 (e.g., a direct bonded copper (DBC) substrate), a substrate 820-2 (e.g., DBC substrate), and the fan out packages 802-1, 802-2 disposed between and coupled to the substrate 820-1 and the substrate 820-2. In some examples, the power module 800 includes a lead frame portion 838-1 and a lead frame portion 838-2 disposed between and coupled to the substrate 820-1 and the substrate 820-2. The conductive plates 806 of the fan out package 802-1 is coupled to the substrate 820-1, and the conductive plates 806 of the fan out package 802-2 is coupled to the substrate 820-2 (e.g., one of the fan out packages is flipped with respect to the other fan out package).

The substrate 820-1 includes a dielectric layer 824. The dielectric layer 824 includes an insulating material. In some examples, the dielectric layer 824 includes a ceramic material. In some examples, the substrate 820-1 includes a single dielectric layer 824. In some examples, the substrate 820-1 includes multiple dielectric layers 824. In some examples, the substrate 820-1 includes a printed circuit board (PCB) substrate (e.g., a single layer of PCB or multiple layers of PCB). In some examples, the substrate 820-1 includes a conductive layer 822 coupled to one surface of the dielectric layer 824, and a conductive layer 826 coupled to the other surface of the dielectric layer 824. In some examples, the conductive layer 822 includes a copper layer. In some examples, the conductive layer 826 includes a copper layer. In some examples, the substrate 820-1 is a direct bonded metal (DBM) substrate (e.g., a substrate with a dielectric disposed between two metal layers) such as a direct bonded copper (DBC) substrate. The substrate 820-2 may be the same/similar as the substrate 820-1. For example, the substrate 820-2 also includes a dielectric layer 824, a conductive layer 822, and a conductive layer 826.

The conductive layer 822 of the substrate 820-1 includes an inner surface 833 aligned in a plane A4. A direction A1 is aligned perpendicular to the plane A4, and a direction A2 is perpendicular to the direction A1. A direction A3 into the page (shown as a dot in FIGS. 1A and 1B) is aligned parallel to the plane A4 and is orthogonal to directions A1 and A2. The fan out package 802-1 and the fan out package 802-2 are coupled to and disposed between the substrate 820-1 and the substrate 820-2.

The fan out package 802-1 includes semiconductor dies 804, a redistribution layer 808 coupled to the frontside (e.g., the source, gate) of the semiconductor dies 804, and a plurality of conductive plates 806 coupled to the backside (e.g., the drain) of the semiconductor dies 804. Also, the fan out package 802-1 includes a passivation layer 810 applied to the backside of the semiconductor dies 804, and an encapsulation material 814 that contacts the semiconductor dies 804 and the conductive plates 806.

The fan out package 802-2 includes semiconductor dies 804, a redistribution layer 808 coupled to the frontside (e.g., the source, gate) of the semiconductor dies 804, and a plurality of conductive plates 806 coupled to the backside (e.g., the drain) of the semiconductor dies 804. Also, the fan out package 802-2 includes a passivation layer 810 applied to the backside of the semiconductor dies 804, and an encapsulation material 814 that contacts the semiconductor dies 804 and the conductive plates 806.

The fan out package 802-1 may be coupled to the substrate 820-1 via an attachment layer 828, and the fan out package 802-1 may be coupled to the substrate 820-2 via an attachment layer 828. An attachment layer 828 may include a bonding material (e.g., solder, sinter, or other adhesives) that can bond conductive components together. The conductive plates 806 of the fan out package 802-1 is coupled to the conductive layer 822 of the substrate 820-1 via an attachment layer 828. The redistribution layer 808 of the fan out package 802-1 is coupled to the conductive layer 822 of the substrate 820-2 via an attachment layer 828.

The fan out package 802-2 may be coupled to the substrate 820-1 via an attachment layer 828, and the fan out package 802-2 may be coupled to the substrate 820-2 via an attachment layer 828. The conductive plates 806 of the fan out package 802-2 is coupled to the conductive layer 822 of the substrate 820-2 via an attachment layer 828. The redistribution layer 808 of the fan out package 802-2 is coupled to the conductive layer 822 of the substrate 820-1 via an attachment layer 828.

The lead frame portion 838-1 may be disposed between and coupled to the substrate 820-1 and the substrate 820-2. For example, the lead frame portion 838-1 is coupled to the conductive layer 822 of the substrate 820-1 and to the conductive layer 822 of the substrate 820-2. The lead frame portion 838-2 may be disposed between and coupled to the substrate 820-1 and the substrate 820-2. For example, the lead frame portion 838-2 is coupled to the conductive layer 822 of the substrate 820-1 and to the conductive layer 822 of the substrate 820-2. The fan out package 802-1 and the fan out package 802-2 are disposed between the lead frame portion 838-1 and the lead frame portion 838-2 in the direction A2.

The power module 800 includes an encapsulation material 846. The encapsulation material 846 may contact the edges of the substrate 820-1 and the edges of the substrate 820-2. The encapsulation material 846 may contact portions of the lead frame portion 838-1 and portions of the lead frame portion 838-2. Also, the encapsulation material 846 may contact the fan out package 802-1 and the fan out package 802-2.

Figure 9:
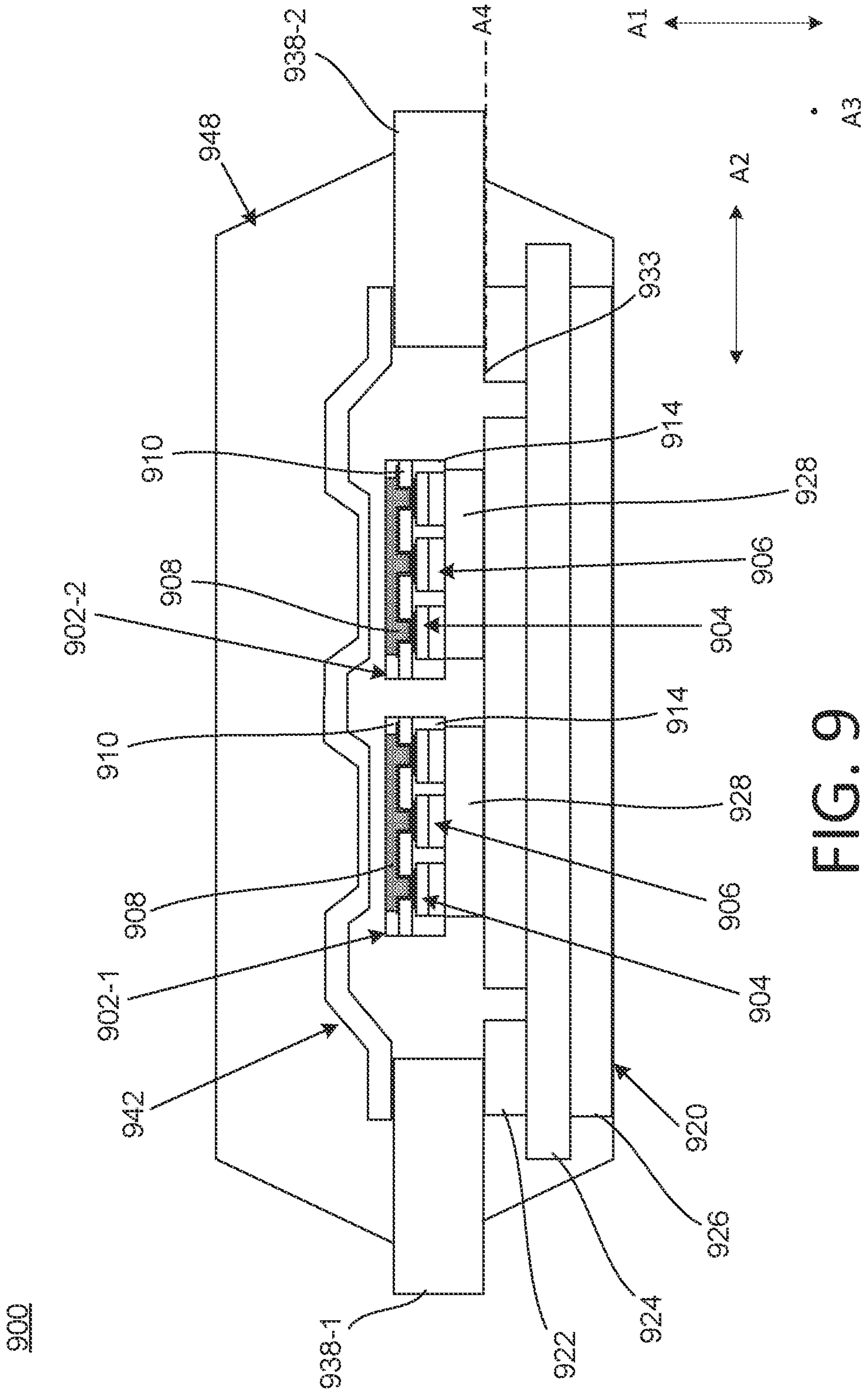
FIG. 9 illustrates a single side cooling power module with multiple fan out packages according to an aspect.

FIG. 9 illustrates an example of a power module 900. In some examples, the power module 900 includes a single side cooling (DSC) power module. The power module 900 includes multiple fan out packages such as a fan out package 902-1 and a fan out package 902-1. The fan out package 902-1 and the fan out package 902-2 may be an example of the fan out package 102 of FIGS. 1A and 1B, the fan out package 602 of FIGS. 6A to 6E, and/or the fan out package 702 of FIGS. 7A to 7E and may include any of the details discussed with reference to those figures. The power module 900 may include a substrate 920 (e.g., a direct bonded copper (DBC) substrate), a clip member 942, and the fan out packages 902-1, 902-2 disposed between and coupled to the substrate 920 and the clip member 942. In some examples, the power module 900 includes a lead frame portion 938-1 and a lead frame portion 938-2 disposed between and coupled to the substrate 920 and the clip member 942. The conductive plates 906 of the fan out package 902-1 is coupled to the substrate 920, and the conductive plates 906 of the fan out package 902-2 is coupled to the substrate 920 (e.g., the fan out packages 902-1, 902-2 have the same orientation).

The substrate 920 includes a dielectric layer 924. The dielectric layer 924 includes an insulating material. In some examples, the dielectric layer 924 includes a ceramic material. In some examples, the substrate 920 includes a single dielectric layer 924. In some examples, the substrate 920 includes multiple dielectric layers 924. In some examples, the substrate 920 includes a printed circuit board (PCB) substrate (e.g., a single layer of PCB or multiple layers of PCB). In some examples, the substrate 920 includes a conductive layer 922 coupled to one surface of the dielectric layer 924, and a conductive layer 926 coupled to the other surface of the dielectric layer 924. In some examples, the conductive layer 922 includes a copper layer. In some examples, the conductive layer 926 includes a copper layer. In some examples, the substrate 920 is a direct bonded metal (DBM) substrate (e.g., a substrate with a dielectric disposed between two metal layers) such as a direct bonded copper (DBC) substrate. The conductive layer 922 of the substrate 920 includes an inner surface 933 aligned in a plane A4. A direction A1 is aligned perpendicular to the plane A4, and a direction A2 is perpendicular to the direction A1. A direction A3 into the page (shown as a dot in FIGS. 1A and 1B) is aligned parallel to the plane A4 and is orthogonal to directions A1 and A2.

The clip member 942 includes a conductive material. In some examples, the clip member 942 may include portions that extend in the direction A1 and the direction A2. In some examples, the clip member 942 includes portions that are disposed in parallel with each at multiple planes in the direction A2. In some examples, the clip member 942 includes portions disposed at an angle (e.g., a non-zero, non-perpendicular angle) with respect to each other. The fan out package 902-1 and the fan out package 902-2 are coupled to and disposed between the substrate 920 and the clip member 942.

The fan out package 902-1 includes semiconductor dies 904, a redistribution layer 908 coupled to the frontside (e.g., the source, gate) of the semiconductor dies 904, and conductive plates 906 coupled to the backside (e.g., the drain) of the semiconductor dies 904. Also, the fan out package 902-1 includes a passivation layer 910 applied to the backside of the semiconductor dies 904, and an encapsulation material 914 that contacts the semiconductor dies 904 and the conductive plates 906.

The fan out package 902-2 includes semiconductor dies 904, a redistribution layer 908 coupled to the frontside (e.g., the source, gate) of the semiconductor dies 904, and conductive plates 906 coupled to the backside (e.g., the drain) of the semiconductor dies 904. Also, the fan out package 902-2 includes a passivation layer 910 applied to the backside of the semiconductor dies 309, and an encapsulation material 914 that contacts the semiconductor dies 904 and the conductive plates 906.

The fan out package 902-1 may be coupled to the substrate 920 via an attachment layer 928, and the fan out package 902-2 may contact (e.g., directly contact) the clip member 942. An attachment layer 928 may include a bonding material (e.g., solder, sinter, or other adhesives) that can bond conductive components together. The conductive plates 906 of the fan out package 902-1 is coupled to the conductive layer 922 of the substrate 920 via an attachment layer 928. The redistribution layer 908 of the fan out package 902-1 contacts the clip member 942. The fan out package 902-2 may be coupled to the substrate 920 via an attachment layer 328, and the fan out package 902-2 may contact the clip member 942. The conductive plates 906 of the fan out package 902-2 are coupled to the conductive layer 922 of the substrate 920 via an attachment layer 928. The redistribution layer 908 of the fan out package 902-2 contacts the clip member 942.

The lead frame portion 938-1 may be disposed between and coupled to the substrate 920 and the clip member 942. For example, the lead frame portion 938-1 is coupled to the conductive layer 922 of the substrate 920 and to the clip member 942. The lead frame portion 938-2 may be disposed between and coupled to the substrate 920 and the clip member 942. For example, the lead frame portion 938-2 is coupled to the conductive layer 922 of the substrate 920 and to the clip member 942. The fan out package 902-1 and the fan out package 902-2 are disposed between the lead frame portion 938-1 and the lead frame portion 938-2 in the direction A2. The power module 900 includes an encapsulation material 948. The encapsulation material 948 may contact portions of the substrate 920 and the clip member 942. The encapsulation material 948 may contact portions of the lead frame portion 938-1 and portions of the lead frame portion 938-2. Also, the encapsulation material 948 may contact the fan out package 902-1 and the fan out package 902-2.

Figure 10A:
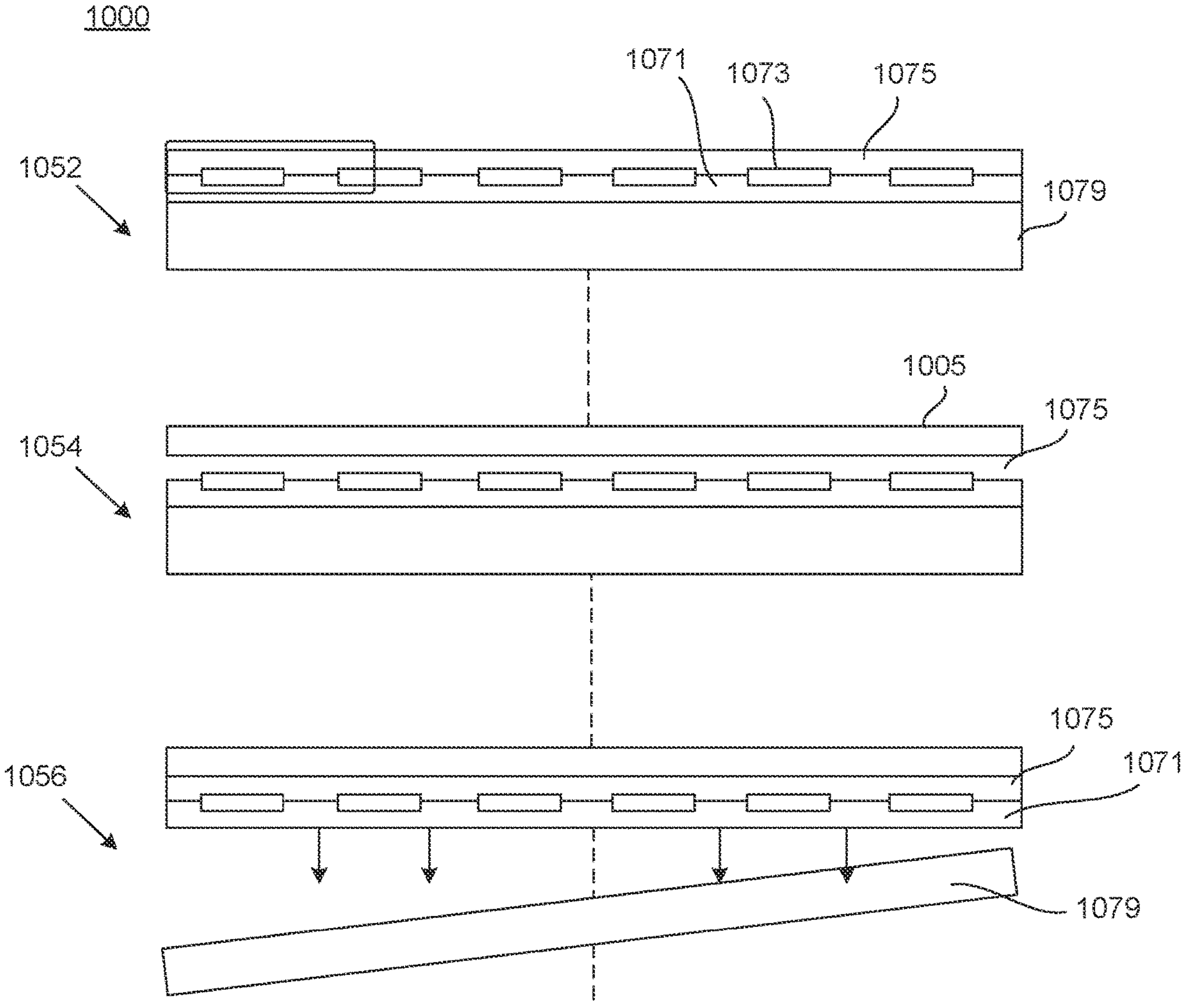
FIGS. 10A through 10C illustrate a manufacturing process of creating individual fan out packages according to an aspect.
Figure 10B:
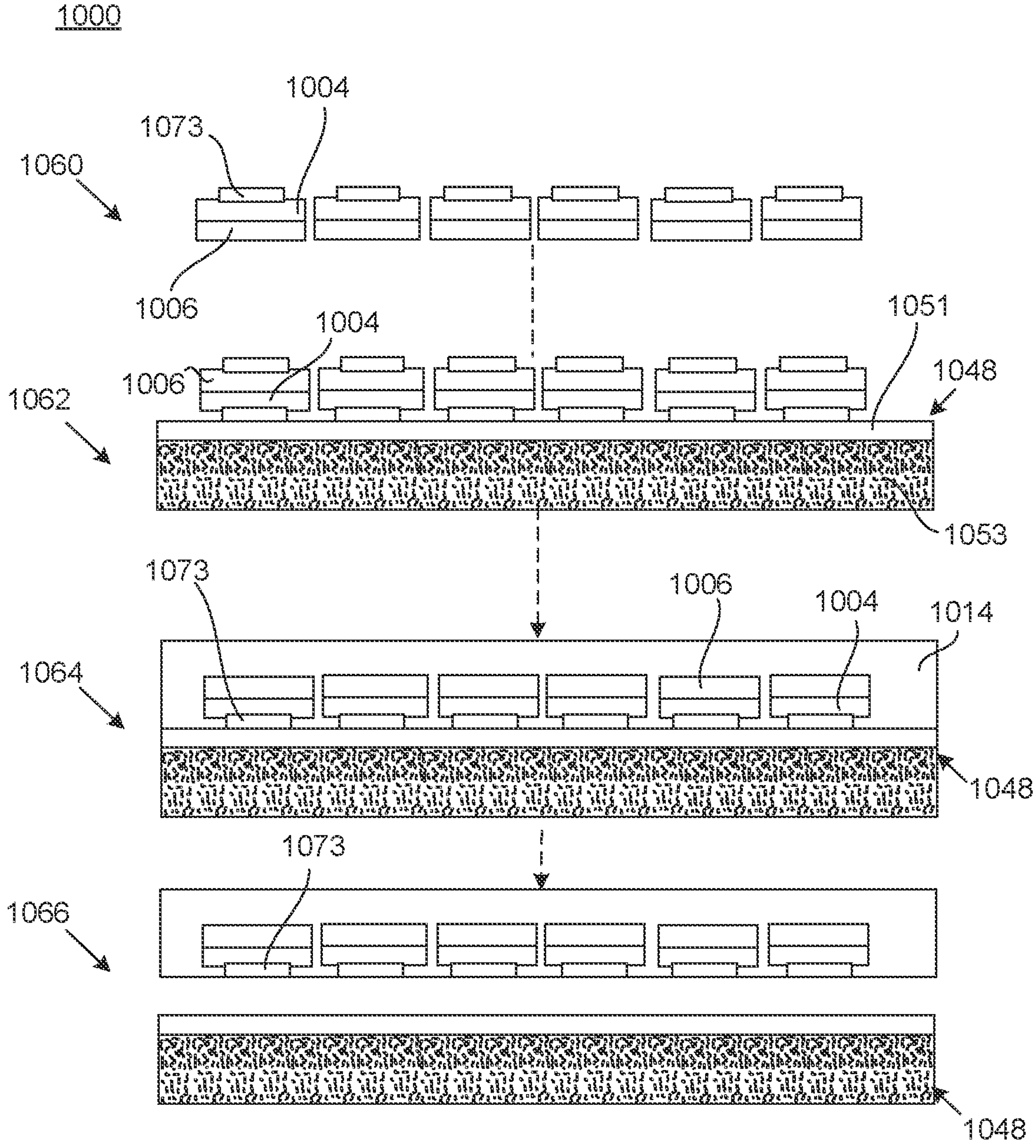
Figure 10C:
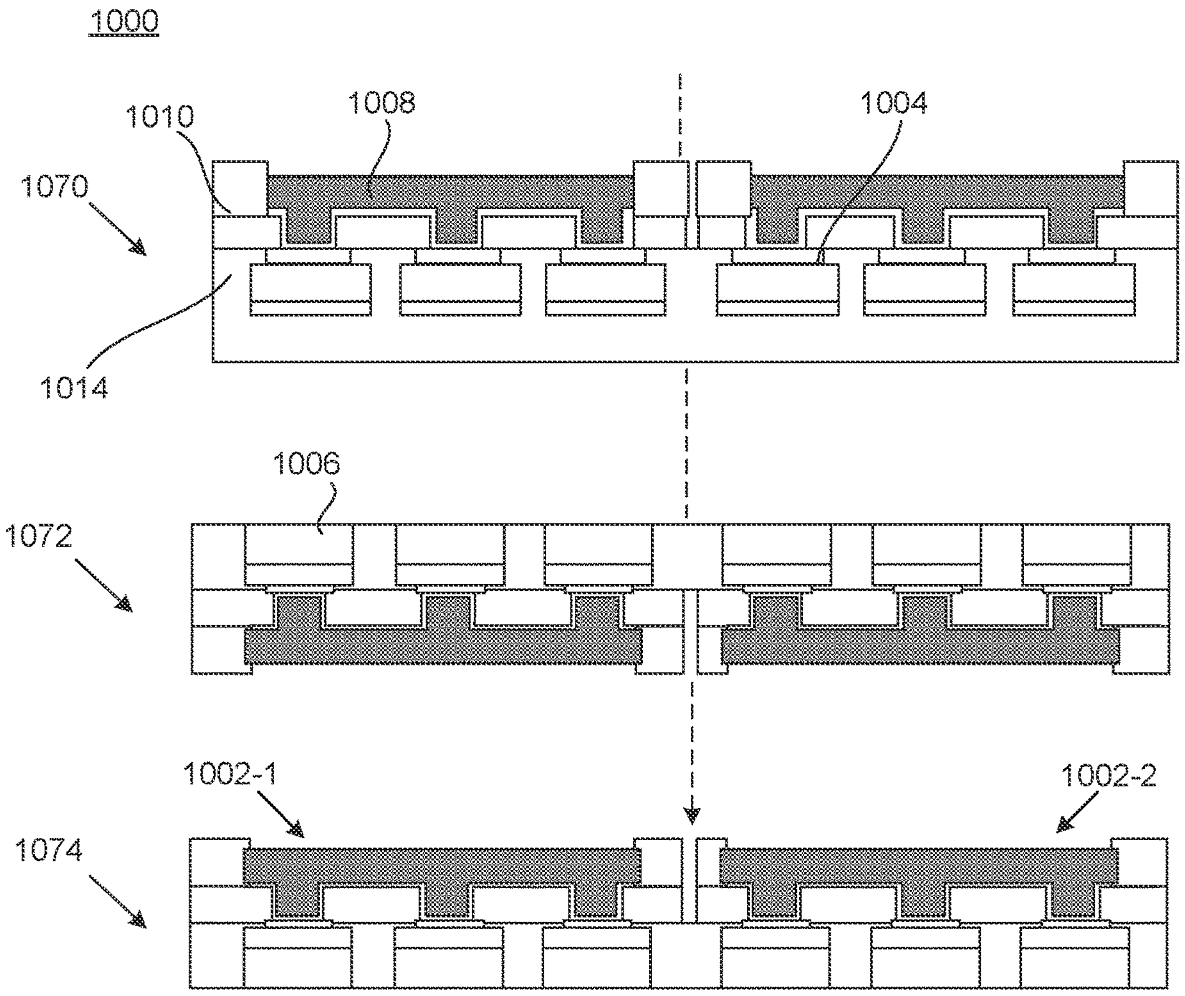

FIGS. 10A to 10C illustrate a manufacturing process 1000 for manufacturing a fan out package according to an aspect. In some examples, the manufacturing process 1000 creates the fan out packages 602 of FIGS. 6A to 6E or the fan out packages 702 of FIGS. 7A to 7E.

Operation 1052 includes bonding a silicon wafer 1075 with conductive pads 1073 to a wafer 1079 (e.g., a glass wafer) using an adhesive material 1071. Operation 1054 includes applying conductive plating 1005 to the backside of the silicon wafer 1075. Operation 1056 includes removing the wafer 1079 from the silicon wafer 1075. Operation 1060 includes applying a die saw operation to create individual semiconductor dies 1004 with a conductive pad 1073 coupled to the front-side of a semiconductor die 1004 and a conductive plate 1006 coupled to the backside of a semiconductor die 1004. Operation 1062 includes a pick and place operation (e.g., die constitution) that attaches a carrier assembly 1048 (with a carrier 1053 coupled to a film 1051) to the conductive pads 1073. Operation 1064 includes applying an encapsulation material 1014 to the carrier assembly 1048, the semiconductor dies 1004, the conductive pads 1073, and the conductive plates 1006. Operation 1066 includes removing the carrier assembly 1048. Operation 1070 includes forming a redistribution layer 1008 and a passivation layer 1010. Operation 1072 includes removing a portion of the encapsulation material 1014 to expose a surface of the conductive plates 1006. Operation 1074 includes a singulation process to separate the fan out packages, e.g., the fan out package 1002-1 and the fan out package 1002-2.

Figure 11:
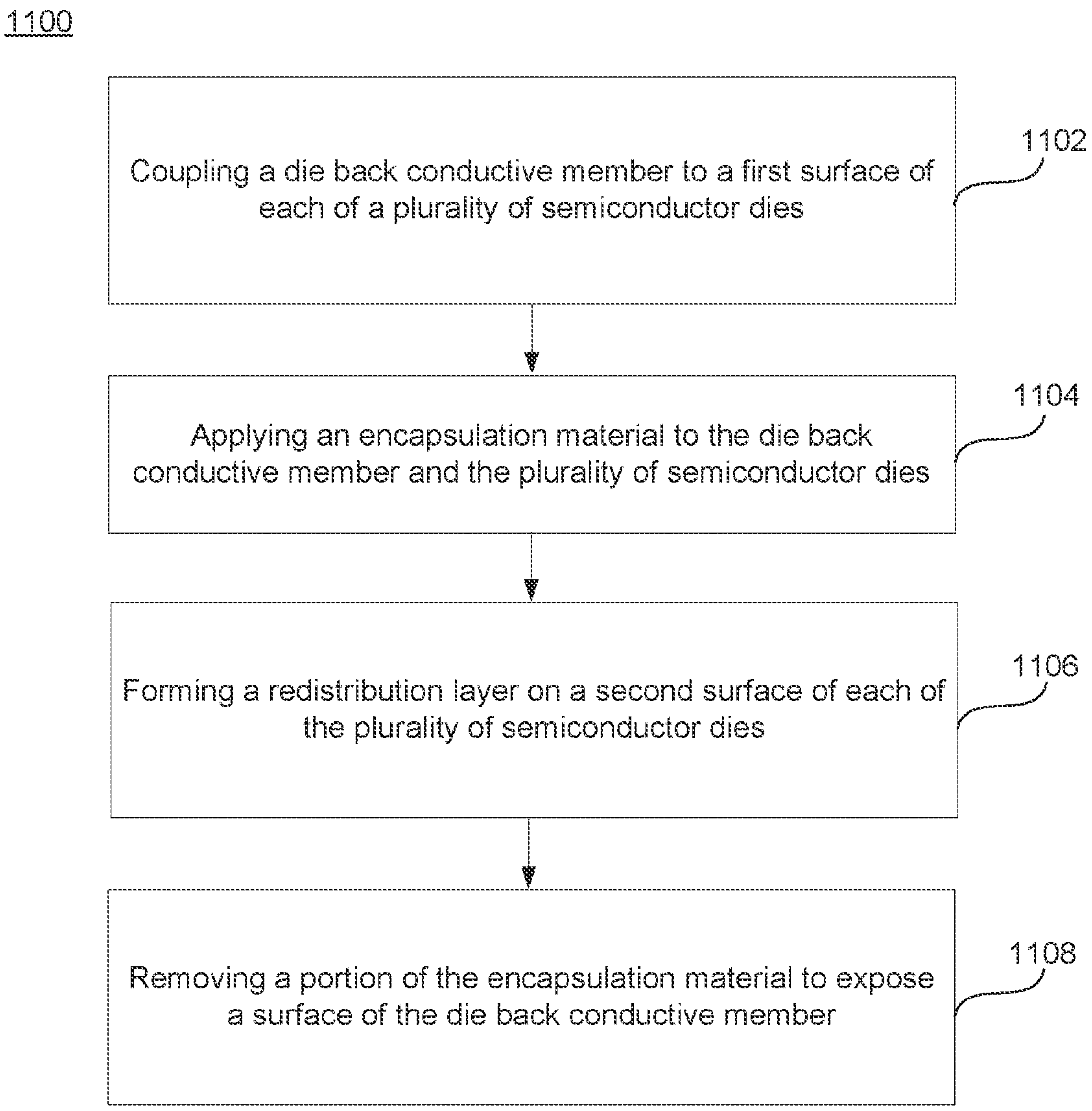
FIG. 11 illustrates a flowchart depicting example operations of manufacturing a fan out package according to an aspect.

FIG. 11 depicts a flowchart 1100 depicting a method with example operations for manufacturing a fan out package according to an aspect. Although the flowchart 1100 is described with reference to the fan out package 102 of FIGS. 1A and 1B, the flowchart may be applicable to any of the fan out packages discussed herein. Although the flowchart 1100 of FIG. 11 illustrates operations in sequential order, it will be appreciated that this is merely an example, and that additional or alternative operations may be included. Further, operations of FIG. 11 and related operations may be executed in a different order than that shown, or in a parallel or overlapping fashion.

Operation 1102 includes coupling a dieback conductive member to a first surface of each of a plurality of semiconductor dies. Operation 1104 includes applying an encapsulation material to the dieback conductive member and the plurality of semiconductor dies. Operation 1106 includes forming a redistribution layer on a second surface of each of the plurality of semiconductor dies. Operation 1108 includes removing a portion of the encapsulation material to expose a surface of the dieback conductive member.

Clause 1. A fan out package comprising: a plurality of semiconductor dies, each of the semiconductor dies including a first surface and a second surface opposite to the first surface; a redistribution layer coupled to the first surface of each of the plurality of semiconductor dies; a dieback conductive member coupled to the second surface of each of the plurality of semiconductors dies; and an encapsulation material coupled to the plurality of semiconductor dies and the dieback conductive member.

Clause 2. The fan out package of clause 1, wherein the dieback conductive member includes a single conductive spacer coupled to the plurality of semiconductor dies.

Clause 3. The fan out package of clause 1 or 2, wherein the dieback conductive member includes a plurality of conductive plates, each of the plurality of conductive plates coupled to a separate semiconductor die of the plurality of semiconductor dies.

Clause 4. The fan out package of any of clauses 1 to 3, further comprising: a passivation layer coupled to the plurality of semiconductors.

Clause 5. The fan out package of any of clauses 1 to 4, wherein the plurality of semiconductors includes a first semiconductor die, a second semiconductor die, and a third semiconductor die.

Clause 6. The fan out package of any of clauses 1 to 5, wherein the redistribution layer includes a source contact pad that is common to the plurality of semiconductor dies.

Clause 7. The fan out package of any of clauses 1 to 6, wherein the dieback conductive member includes a drain contact pad that is common to the plurality of semiconductor dies.

Clause 8. A power module comprising: a substrate; a first fan out package coupled to the substrate; and a second fan out package coupled to the substrate, each of the first fan out package and the second fan out package including: a plurality of semiconductor dies, each of the semiconductor dies including a first surface and a second surface opposite to the first surface; a redistribution layer coupled to the first surface of each of the plurality of semiconductor dies; a dieback conductive member coupled to the second surface of each of the plurality of semiconductors dies; and an encapsulation material coupled to the plurality of semiconductor dies and the dieback conductive member.

Clause 9. The power module of clause 8, wherein the substrate is a first substrate, the power module further comprising: a second substrate, the first and second fan out packages being disposed between and coupled to the first substrate and the second substrate.

Clause 10. The power module of clause 9, wherein the dieback conductive member of the first fan out package is coupled to the first substrate, and the dieback conductive member of the second fan out package is coupled to the second substrate.

Clause 11. The power module of any of clauses 8 to 10, further comprising: a first lead frame portion disposed between and coupled to the first substrate and the second substrate; and a second lead frame portion disposed between and coupled to the first substrate and the second substrate.

Clause 12. The power module of any of clauses 8 to 11, further comprising: a clip member, the first and second fan out packages disposed between and coupled to the substrate and the clip member.

Clause 13. The power module of clause 12, wherein the dieback conductive member of the first fan out package is coupled to the substrate, and the dieback conductive member of the second fan out package is coupled to the substrate.

Clause 14. The power module of clause 12, wherein the substrate includes a first conductive layer, a second conductive layer, and a dielectric layer disposed between and coupled to the first conductive layer and the second conductive layer.

Clause 15. The power module of any of clauses 8 to 14, wherein the encapsulation material is a first encapsulation material, the power module further comprising: a second encapsulation material coupled to the substrate, the first fan out package, and the second fan out package.

Clause 16. A method for manufacturing a fan out package, the method comprising: coupling a dieback conductive member to a first surface of each of a plurality of semiconductor dies; applying an encapsulation material to the dieback conductive member and the plurality of semiconductor dies; forming a redistribution layer on a second surface of each of the plurality of semiconductor dies; and removing a portion of the encapsulation material to expose a surface of the dieback conductive member.

Clause 17. The method of clause 16, wherein the dieback conductive member includes a single conductive spacer coupled to the plurality of semiconductor dies.

Clause 18. The method of clause 16 or 17, wherein the dieback conductive member includes a plurality of conductive plates, each of the plurality of conductive plates coupled to a separate semiconductor die of the plurality of semiconductor dies.

Clause 19. The method of clause 18, further comprising: applying a metal layer to the first surface of each of a plurality of semiconductor dies; and removing a portion of the metal layer between adjacent semiconductor dies to form the plurality of conductive plates.

Clause 20. The method of any of clauses 16 to 19, further comprising: forming a passivation layer on the first surface of each of the plurality of semiconductor dies.

It will be understood that, in the foregoing description, when an element is referred to as being connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements. Although the terms directly connected to, or directly coupled to may not be used throughout the detailed description, elements that are shown as being directly connected or directly coupled can be referred to as such. The claims of the application, if any, may be amended to recite exemplary relationships described in the specification or shown in the figures. Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A fan out package comprising:
- a plurality of semiconductor dies, each of the plurality of semiconductor dies including a first surface and a second surface opposite to the first surface;
- a passivation layer coupled to the plurality of semiconductor dies;
- a redistribution layer coupled to the first surface of each of the plurality of semiconductor dies, the redistribution layer including a source contact pad that is common to the plurality of semiconductor dies, at least a portion of the source contact pad being exposed through the passivation layer;
- a dieback conductive member coupled to the second surface of each of the plurality of semiconductor dies; and
- an encapsulation material coupled to the plurality of semiconductor dies and the dieback conductive member.

2. The fan out package of claim 1, wherein the dieback conductive member includes a single conductive spacer coupled to the plurality of semiconductor dies.

3. The fan out package of claim 1, wherein the dieback conductive member includes a plurality of conductive plates, each of the plurality of conductive plates coupled to a separate semiconductor die of the plurality of semiconductor dies.

4. The fan out package of claim 1, wherein the plurality of semiconductor dies includes a first semiconductor die, a second semiconductor die, and a third semiconductor die.

5. The fan out package of claim 1, wherein the dieback conductive member includes a drain contact pad that is common to the plurality of semiconductor dies.

6. The fan out package of claim 1, wherein the redistribution layer includes a first portion that extends through the passivation layer in a first direction and connects to a first source terminal of a first semiconductor die of the plurality of semiconductor dies, the redistribution layer includes a second portion that extends through the passivation layer in the first direction and connects to a second source terminal of a second semiconductor die of the plurality of semiconductor dies.

7. The fan out package of claim 6, wherein the source contact pad includes a surface that extends in a second direction, the second direction being orthogonal to the first direction.

8. The fan out package of claim 1, wherein the source contact pad is disposed on an outer surface of the redistribution layer.

9. A power module comprising:
- a substrate;
- a first fan out package coupled to the substrate; and
- a second fan out package coupled to the substrate, each of the first fan out package and the second fan out package including:
  - a plurality of semiconductor dies, each of the plurality of semiconductor dies including a first surface and a second surface opposite to the first surface;
  - a passivation layer coupled to the plurality of semiconductor dies;
  - a redistribution layer coupled to the first surface of each of the plurality of semiconductor dies, the redistribution layer including a source contact pad that is common to the plurality of semiconductor dies, at least a portion of the source contact pad being exposed through the passivation layer;
  - a dieback conductive member coupled to the second surface of each of the plurality of semiconductor dies; and
  - an encapsulation material coupled to the plurality of semiconductor dies and the dieback conductive member.

10. The power module of claim 9, wherein the substrate is a first substrate, the power module further comprising:
- a second substrate, the first fan out package being disposed between and coupled to the first substrate and the second substrate, the second fan out package being disposed between and coupled to the first substrate and the second substrate.

11. The power module of claim 10, wherein the dieback conductive member of the first fan out package is coupled to the first substrate, and the dieback conductive member of the second fan out package is coupled to the second substrate.

12. The power module of claim 10, further comprising:
- a first lead frame portion disposed between and coupled to the first substrate and the second substrate; and
- a second lead frame portion disposed between and coupled to the first substrate and the second substrate.

13. The power module of claim 9, further comprising:

a clip member, the first fan out package disposed between and coupled to the substrate and the clip member, the second fan out package disposed between and coupled to the substrate and the clip member.

14. The power module of claim 13, wherein the dieback conductive member of the first fan out package is coupled to the substrate, and the dieback conductive member of the second fan out package is coupled to the substrate.

15. The power module of claim 13, wherein the substrate includes a first conductive layer, a second conductive layer, and a dielectric layer disposed between and coupled to the first conductive layer and the second conductive layer.

16. The power module of claim 9, wherein the encapsulation material is a first encapsulation material, the power module further comprising:

a second encapsulation material coupled to the substrate, the first fan out package, and the second fan out package.

17. A method for manufacturing a fan out package, the method comprising:

coupling a dieback conductive member to a first surface of each of a plurality of semiconductor dies;

applying an encapsulation material to the dieback conductive member and the plurality of semiconductor dies;

forming a redistribution layer on a second surface of each of the plurality of semiconductor dies, the redistribution layer including a source contact pad that is common to the plurality of semiconductor dies;

forming a passivation layer on the plurality of semiconductor dies and on the redistribution layer;

removing a portion of the passivation layer to expose at least a portion of the source contact pad through the passivation layer; and removing a portion of the encapsulation material to expose a surface of the dieback conductive member.

18. The method of claim 17, wherein the dieback conductive member includes a single conductive spacer coupled to the plurality of semiconductor dies.

19. The method of claim 17, wherein the dieback conductive member includes a plurality of conductive plates, each of the plurality of conductive plates coupled to a separate semiconductor die of the plurality of semiconductor dies.

20. The method of claim 19, further comprising:

applying a metal layer to the first surface of each of the plurality of semiconductor dies; and removing a portion of the metal layer between adjacent semiconductor dies to form the plurality of conductive plates.

* * * * *